United States Patent
De Campo et al.

(10) Patent No.: US 10,407,581 B2
(45) Date of Patent: Sep. 10, 2019

(54) NON-AQUEOUS COMPOSITIONS HAVING SULFONATED POLYTHIOPHENES SUITABLE FOR USE IN ORGANIC ELECTRONICS

(71) Applicant: NISSAN CHEMICAL INDUSTRIES, LTD., Tokyo (JP)

(72) Inventors: Floryan De Campo, Pittsburgh, PA (US); Robert Swisher, Pittsburgh, PA (US); Elena Sheina, Pittsburgh, PA (US); Jing Wang, Gibsonia, PA (US); Carolyn Skillman, Zelienople, PA (US)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 15/566,796

(22) PCT Filed: Apr. 11, 2016

(86) PCT No.: PCT/US2016/026905
§ 371 (c)(1),
(2) Date: Oct. 16, 2017

(87) PCT Pub. No.: WO2016/171935
PCT Pub. Date: Oct. 27, 2016

(65) Prior Publication Data
US 2018/0105709 A1    Apr. 19, 2018

Related U.S. Application Data

(60) Provisional application No. 62/151,260, filed on Apr. 22, 2015.

(51) Int. Cl.
*C09D 11/102* (2014.01)
*H01L 51/00* (2006.01)
(Continued)

(52) U.S. Cl.
CPC .......... *C09D 11/102* (2013.01); *C09D 11/033* (2013.01); *C09D 11/106* (2013.01);
(Continued)

(58) Field of Classification Search
CPC ..... C09D 11/102; C09D 11/033; C09D 11/36; C09D 11/108; C09D 11/52; H01L 51/0036
See application file for complete search history.

(56) References Cited

U.S. PATENT DOCUMENTS

| | | | |
|---|---|---|---|
| 4,356,429 A | 10/1982 | Tang | |
| 4,539,507 A | 9/1985 | Vanslyke et al. | |

(Continued)

FOREIGN PATENT DOCUMENTS

| | | |
|---|---|---|
| JP | 2011-513977 A | 4/2011 |
| JP | 2012-525487 A | 10/2012 |
| JP | 2014-504422 A | 2/2014 |

OTHER PUBLICATIONS

International Search Report received in connection with international application No. PCT/US2016/026905; dated Jul. 27, 2016.
(Continued)

*Primary Examiner* — Michael Jung
(74) *Attorney, Agent, or Firm* — The Marbury Law Group, PLLC

(57) ABSTRACT

Described herein are non-aqueous ink compositions containing a sulfonated conjugated polymer, a polymeric acid, an optional matrix compound, and an amine compound. The present disclosure also concerns the uses of such non-aqueous ink compositions, for example, in organic electronic devices.

38 Claims, 8 Drawing Sheets

(51) Int. Cl.
*C09D 11/033* (2014.01)
*C09D 11/106* (2014.01)
*C09D 11/36* (2014.01)
*C09D 11/52* (2014.01)
*C09D 11/108* (2014.01)
*H01L 51/50* (2006.01)
*H01L 51/05* (2006.01)
*H01L 51/42* (2006.01)

(52) U.S. Cl.
CPC ............ *C09D 11/108* (2013.01); *C09D 11/36* (2013.01); *C09D 11/52* (2013.01); *H01L 51/0036* (2013.01); *H01L 51/0005* (2013.01); *H01L 51/0026* (2013.01); *H01L 51/0558* (2013.01); *H01L 51/42* (2013.01); *H01L 51/5056* (2013.01); *H01L 51/5088* (2013.01); *H01L 2251/556* (2013.01); *Y02E 10/549* (2013.01)

(56) References Cited

U.S. PATENT DOCUMENTS

| | | | |
|---|---|---|---|
| 5,047,687 A | 9/1991 | Vanslyke | |
| 5,247,190 A | 9/1993 | Friend et al. | |
| 5,401,827 A | 3/1995 | Holmes et al. | |
| 5,454,880 A | 10/1995 | Sariciftci et al. | |
| 6,166,172 A | 12/2000 | McCullough et al. | |
| 6,602,974 B1 | 8/2003 | McCullough et al. | |
| 6,812,399 B2 | 11/2004 | Shaheen et al. | |
| 6,933,436 B2 | 8/2005 | Shaheen et al. | |
| 7,455,793 B2 | 11/2008 | Hsu et al. | |
| 8,017,241 B2 | 9/2011 | Seshadri et al. | |
| 8,784,692 B2 | 7/2014 | Hsu et al. | |
| 2005/0202274 A1 | 9/2005 | Elschner et al. | |
| 2006/0175582 A1 | 8/2006 | Hammond et al. | |
| 2008/0248313 A1 | 10/2008 | Seshadri et al. | |
| 2009/0230361 A1 | 9/2009 | Seshadri et al. | |
| 2010/0108954 A1 | 5/2010 | Benson-Smith et al. | |
| 2010/0109000 A1 | 5/2010 | Mathai et al. | |
| 2010/0292399 A1 | 11/2010 | Brown et al. | |
| 2012/0001127 A1* | 1/2012 | Brown .................. | C07D 403/00 252/500 |
| 2013/0109813 A1 | 5/2013 | Sheina et al. | |
| 2013/0324716 A1* | 12/2013 | Brown .................. | H01L 51/006 544/35 |
| 2014/0117380 A1* | 5/2014 | Loboda ............. | H01L 21/30625 257/77 |
| 2014/0306250 A1* | 10/2014 | Gardner ............. | H01L 25/0753 257/89 |

OTHER PUBLICATIONS

Kraft et al., "Electroluminescent Conjugated Polymers-Seeing Polymers in a New Light", Angew Chem. int. Ed., 1998, 37, pp. 402-428.

Extended European Search Report received in connection with European application No. EP 16783595; dated Sep. 20, 2018.

Office Action received in connection to Japanese Patent Application No. 2017-540161, dated Jun. 4, 2019 (with English translation).

* cited by examiner

NON-AQUEOUS COMPOSITIONS HAVING SULFONATED POLYTHIOPHENES SUITABLE FOR USE IN ORGANIC ELECTRONICS

CROSS REFERENCE TO RELATED APPLICATIONS

This application claims priority to U.S. Provisional Application No. 62/151,260, filed on Apr. 22, 2015, the entire content of which is explicitly incorporated herein by this reference.

FIELD OF THE INVENTION

The present disclosure relates to non-aqueous ink compositions comprising a sulfonated conjugated polymer, a polymeric acid, optionally, a matrix compound, and an amine compound. The present disclosure also concerns the uses of such non-aqueous ink compositions, for example, in organic electronic devices.

BACKGROUND

Although useful advances are being made in energy saving devices such as, for example, organic-based organic light emitting diodes (OLEDs), polymer light emitting diodes (PLEDs), phosphorescent organic light emitting diodes (PHOLEDs), and organic photovoltaic devices (OPVs), further improvements are still needed in providing better materials processing and/or device performance for commercialization. For example, one promising type of material used in organic electronics is the conducting polymers including, for example, polythiophenes. However, problems can arise with polymers' purity, processability, and instability in their neutral and/or conductive states. Also, it is important to have very good control over the solubility of polymers utilized in alternating layers of various devices' architectures (e.g., orthogonal or alternating solubility properties among adjacent layers in particular device architecture). These layers, for example, also known as hole injection layers (HILs) and hole transport layers (HTLs), can present difficult problems in view of competing demands and the need for very thin, but high quality, films.

There is an ongoing unresolved need for a good platform system to control properties of hole injection and transport layers, such as solubility, thermal/chemical stability, and electronic energy levels, such as HOMO and LUMO, so that the compounds can be adapted for different applications and to function with different compounds, such as light emitting layers, photoactive layers, and electrodes. Good solubility, intractability, and thermal stability properties are important. Also of importance is the ability to tune HIL resistivity and HIL layer thickness while retaining high transparency and low operating voltage. The ability to formulate the system for a particular application and provide the required balance of such properties is also important.

SUMMARY OF THE INVENTION

In a first aspect, the present disclosure relates to a non-aqueous ink composition comprising:
(a) a sulfonated conjugated polymer;
(b) a polymeric acid comprising one or more repeating units comprising at least one alkyl or alkoxy group which is substituted by at least one fluorine atom and at least one sulfonic acid (—SO$_3$H) moiety, wherein said alkyl or alkoxy group is optionally interrupted by at least one ether linkage (—O—) group;
(c) optionally, a matrix compound;
(d) an amine compound; and
(e) a liquid carrier comprising an organic solvent.

In a second aspect, the present disclosure relates to processes for preparing the non-aqueous ink compositions described herein.

In a third aspect, the present disclosure relates to a process for forming a hole-carrying film, the process comprising:
1) coating a substrate with a non-aqueous ink composition disclosed herein; and
2) annealing the coating on the substrate, thereby forming the hole-carrying film.

In a fourth aspect, the present disclosure relates to a device comprising the films prepared according to the processes described herein, wherein the device is an OLED, OPV, transistor, capacitor, sensor, transducer, drug release device, electrochromic device, or battery device.

An objective of the present invention is to provide non-aqueous ink compositions having improved stability and increased shelf-life.

Another objective of the present invention is to improve film formation and enhance film properties, including, but not limited to, reduction in particles in the film and reduction in roughness, using the compositions described herein.

Yet another objective of the present invention is to provide the ability to tune electrical properties, such as resistivity, of HILs in a device comprising the compositions described herein.

Still another objective of the present invention is to provide the ability to tune film thickness and retain high transparency or low absorbance in the visible spectrum (transmittance >90% T) in a device comprising the compositions described herein.

DETAILED DESCRIPTION

Figure 1:
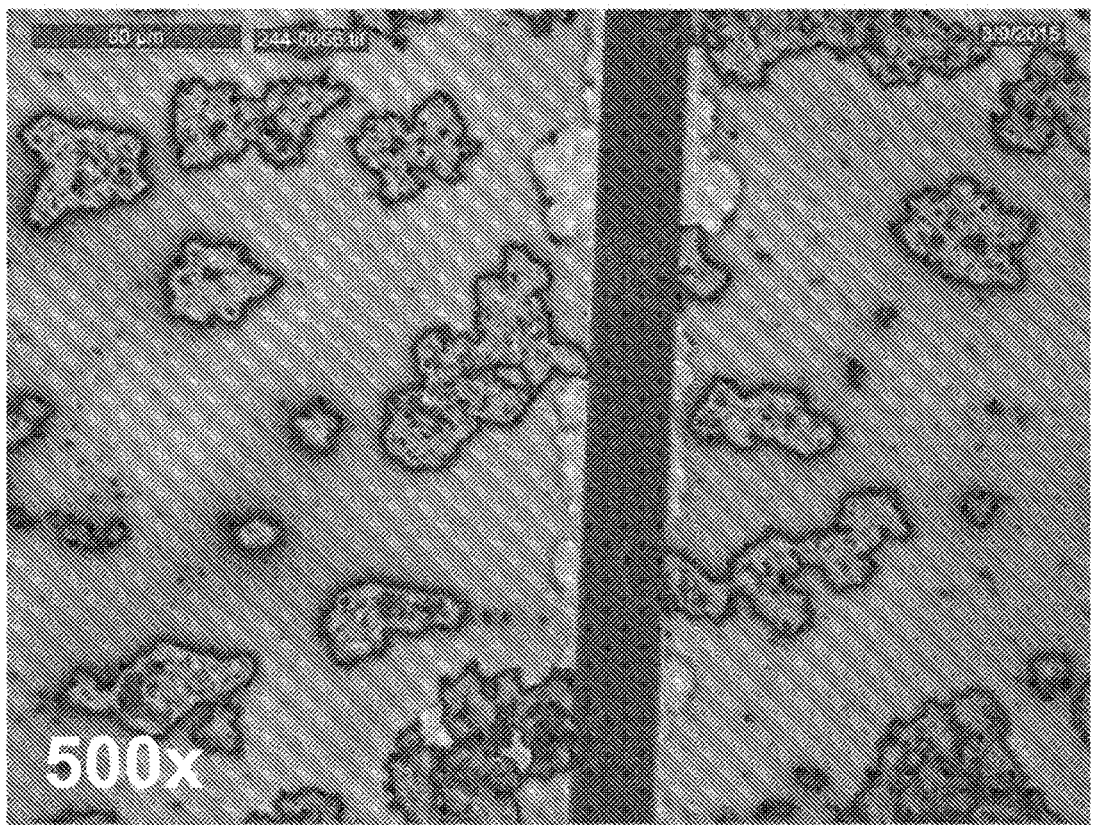
FIG. 1 shows a film formed from a non-inventive non-aqueous ink.

As used herein, the terms "a", "an", or "the" means "one or more" or "at least one" unless otherwise stated.

As used herein, the term "comprises" includes "consists essentially of" and "consists of." The term "comprising" includes "consisting essentially of" and "consisting of."

The phrase "free of" means that there is no external addition of the material modified by the phrase and that there is no detectable amount of the material that may be observed by analytical techniques known to the ordinarily-skilled artisan, such as, for example, gas or liquid chromatography, spectrophotometry, optical microscopy, and the like.

Throughout the present disclosure, various publications may be incorporated by reference. Should the meaning of any language in such publications incorporated by reference conflict with the meaning of the language of the present disclosure, the meaning of the language of the present disclosure shall take precedence, unless otherwise indicated.

As used herein, the terminology "(Cx-Cy)" in reference to an organic group, wherein x and y are each integers, means that the group may contain from x carbon atoms to y carbon atoms per group.

As used herein, the term "alkyl" means a monovalent straight or branched saturated hydrocarbon radical, more typically, a monovalent straight or branched saturated ($C_1$-$C_{40}$) hydrocarbon radical, such as, for example, methyl, ethyl, n-propyl, isopropyl, n-butyl, isobutyl, tert-butyl, hexyl, 2-ethylhexyl, octyl, hexadecyl, octadecyl, eicosyl, behenyl, tricontyl, and tetracontyl.

As used herein, the term "fluoroalkyl" means an alkyl radical as defined herein, more typically a ($C_1$-$C_{40}$) alkyl radical, that is substituted with one or more fluorine atoms. Examples of fluoroalkyl groups include, for example, difluoromethyl, trifluoromethyl, perfluoroalkyl, 1H,1H,2H,2H-perfluorooctyl, perfluoroethyl, and —$CH_2CF_3$.

As used herein, the term "alkoxy" means a monovalent radical denoted as —O-alkyl, wherein the alkyl group is as defined herein. Examples of alkoxy groups, include, but are not limited to, methoxy, ethoxy, n-propoxy, isopropoxy, n-butoxy, isobutoxy, and tert-butoxy.

As used herein, alkyl groups and/or the alkyl portion of alkoxy groups may optionally be interrupted by one or more ether linkage (—O—) groups.

As used herein, the term "aryl" means a monovalent unsaturated hydrocarbon radical containing one or more six-membered carbon rings in which the unsaturation may be represented by three conjugated double bonds. Aryl radicals include monocyclic aryl and polycyclic aryl. Polycyclic aryl refers to a monovalent unsaturated hydrocarbon radical containing more than one six-membered carbon ring in which the unsaturation may be represented by three conjugated double bonds wherein adjacent rings may be linked to each other by one or more bonds or divalent bridging groups or may be fused together. Examples of aryl radicals include, but are not limited to, phenyl, anthracenyl, naphthyl, phenanthrenyl, fluorenyl, and pyrenyl.

Any substituent described herein may optionally be substituted at one or more carbon atoms with one or more, same or different, substituents described herein. For instance, an alkyl group may be further substituted with an aryl group or another alkyl group. Any substituent described herein may optionally be substituted at one or more carbon atoms with one or more substituents selected from the group consisting of halogen, such as, for example, F, Cl, Br, and I; nitro ($NO_2$), cyano (CN), and hydroxy (OH).

As used herein, the term "hole-carrying" or "hole carrier" in relation to a compound or material, such as a film, means that the compound or material is capable of facilitating the movement of holes, i.e., positive charge carriers, and/or blocking the movement of electrons, for example, in an electronic device. Hole-carrying compounds or materials include compounds and materials useful in layers, such as hole transport layers (HTLs), hole injection layers (HILs) and electron blocking layers (EBLs) of electronic devices, typically organic electronic devices, such as, for example, organic light emitting devices.

The present disclosure relates to a non-aqueous ink composition comprising:
(a) a sulfonated conjugated polymer;
(b) a polymeric acid comprising one or more repeating units comprising at least one alkyl or alkoxy group which is substituted by at least one fluorine atom and at least one sulfonic acid (—$SO_3H$) moiety, wherein said alkyl or alkoxy group is optionally interrupted by at least one ether linkage (—O—) group;
(c) optionally, a matrix compound;
(d) an amine compound; and
(e) a liquid carrier comprising an organic solvent.

The ink composition of the present disclosure is non-aqueous. As used herein, "non-aqueous" means that the total amount of water in the ink composition of the present disclosure is from 0 to 2% wt., with respect to the total amount of ink composition. Typically, the total amount of water in the ink composition is from 0 to 1% wt, more typically from 0 to 0.5% wt, with respect to the total amount of the ink composition. In an embodiment, the non-aqueous ink composition of the present disclosure is free of water.

Sulfonated conjugated polymers suitable for use in the non-aqueous ink compositions of the present disclosure are polymers prepared by sulfonation of conjugated polymers, copolymers and/or polymerization of sulfonated monomers and copolymers of thereof. Conjugated polymers and/or copolymers that may be sulfonated include, for example, linear conjugated polymers or conjugated polymer brushes, random, statistical, block and/or alternating copolymers. As used herein, "conjugated polymer" refers to any polymer and/or copolymer having a backbone comprising a continuous system of $sp^2$-hybridized atoms over which π electrons can delocalize.

Sulfonated conjugated polymers suitable for use in the non-aqueous ink compositions of the present disclosure comprise one or more sulfonic acid groups (—$SO_3H$). As used herein, the term "sulfonated" in relation to a conjugated polymer means that the sulfur atom of the —$SO_3H$ group is directly bonded to the backbone of the conjugated polymer and not to a side group. For the purpose of the present disclosure, a side group is a monovalent radical that when theoretically or actually removed from the polymer does not shorten the length of the polymer chain. The sulfonated conjugated polymer and/or copolymer may be made using any method known to those of ordinary skill in the art. For example, a conjugated polymer may be sulfonated by reacting the conjugated polymer with a sulfonating reagent such as, for example, fuming sulfuric acid, acetyl sulfate, pyridine $SO_3$, or the like. In another example, monomers may be sulfonated using a sulfonating reagent and then polymerized according to known methods.

Conjugated polymers that may be sulfonated according to the present disclosure may be homopolymers, copolymers, including statistical, random, gradient, and block copolymers. For a polymer comprising a monomer A and a monomer B, block copolymers include, for example, A-B diblock copolymers, A-B-A triblock copolymers, and -(AB)$_n$-multiblock copolymers. Synthetic methods, doping, and polymer characterization, including regioregular polythiophenes with side groups, is provided in, for example, U.S. Pat. No. 6,602,974 to McCullough et al. and U.S. Pat. No. 6,166,172 to McCullough et al., the entireties of which are hereby incorporated by reference.

Examples of conjugated polymers that may be sulfonated include, but are not limited to, polythiophenes, polythienothiophenes, polyselenophenes, polypyrroles, polyfurans, polytellurophenes, polyanilines, polyarylamines, and polyarylenes (e.g., polyphenylenes, polyphenylene vinylenes, and polyfluorenes. The above conjugated polymers may have side groups that are electron-withdrawing or electron-releasing groups. The side groups may provide for better solubility.

In an embodiment, the sulfonated conjugated polymer is a sulfonated polythiophene.

The sulfonation of conjugated polymers and sulfonated conjugated polymers, including sulfonated polythiophenes, are described in U.S. Pat. No. 8,017,241 to Seshadri et al., which is incorporated herein by reference in its entirety.

In an embodiment, the sulfonated polythiophene is obtained by sulfonation of a polythiophene comprising a repeating unit complying with formula (I)

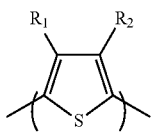

(I)

wherein $R_1$ and $R_2$ are each, independently, H, alkyl, fluoroalkyl, polyether, or alkoxy group.

In an embodiment, $R_1$ and $R_2$ are each, independently, H, fluoroalkyl, —O[C($R_aR_b$)—C($R_cR_d$)—O]$_p$—$R_e$, —O$R_f$; wherein each occurrence of $R_a$, $R_b$, $R_c$, and $R_d$, are each, independently, H, alkyl, fluoroalkyl, or aryl; $R_e$ is H, alkyl, fluoroalkyl, or aryl; p is 1, 2, or 3; and $R_f$ is alkyl, fluoroalkyl, or aryl.

In an embodiment, $R_1$ is H and $R_2$ is other than H. In such an embodiment, the repeating unit is derived from a 3-substituted thiophene.

The sulfonated polythiophene is obtained from a polythiophene that can be a regiorandom or a regioregular compound. Due to its asymmetrical structure, the polymerization of 3-substituted thiophenes produces a mixture of polythiophene structures containing three possible regiochemical linkages between repeat units. The three orientations available when two thiophene rings are joined are the 2,2'; 2,5', and 5,5' couplings. The 2,2' (or head-to-head) coupling and the 5,5' (or tail-to-tail) coupling are referred to as regiorandom couplings. In contrast, the 2,5' (or head-to-tail) coupling is referred to as a regioregular coupling. The degree of regioregularity can be, for example, about 0 to 100%, or about 25 to 99.9%, or about 50 to 98%. Regioregularity may be determined by standard methods known to those of ordinary skill in the art, such as, for example, using NMR spectroscopy.

3-Substituted thiophene monomers, including polymers derived from such monomers, are commercially-available or may be made by methods known to those of ordinary skill in the art. Synthetic methods, doping, and polymer characterization, including regioregular polythiophenes with side groups, is provided in, for example, U.S. Pat. No. 6,602,974 to McCullough et al. and U.S. Pat. No. 6,166,172 to McCullough et al. The sulfonation of conjugated polymers and sulfonated conjugated polymers, including sulfonated polythiophenes, are described in U.S. Pat. No. 8,017,241 to Seshadri et al.

In an embodiment, $R_1$ is H and $R_2$ is —O[C($R_aR_b$)—C($R_cR_d$)—O]$_p$—$R_e$, or —O$R_f$. In an embodiment, $R_1$ is H and $R_2$ is —O[C($R_aR_b$)—C($R_cR_d$)—O]$_p$—$R_e$.

In an embodiment, each occurrence of $R_a$, $R_b$, $R_c$, and $R_d$, are each, independently, (C$_1$-C$_8$) alkyl, (C$_1$-C$_8$) fluoroalkyl, or phenyl; and $R_e$ and $R_f$ are each, independently, H, (C$_1$-C$_8$) alkyl, (C$_1$-C$_8$) fluoroalkyl, or phenyl.

In an embodiment, $R_2$ is —O[CH$_2$—CH$_2$—O]$_p$—$R_e$. In an embodiment, $R_2$ is —O$R_f$.

Examples of compounds having the formula HO[C($R_aR_b$)—C($R_cR_d$)—O]$_p$—$R_e$ or HO$R_f$ that may be converted to the metal salt, typically sodium salt, and linked to the thiophene monomers to form 3-substituted thiophene that are then used to produce the polythiophene to be sulfonated include, but are not limited to, trifluoroethanol, ethylene glycol monohexyl ether (hexyl Cellosolve), propylene glycol monobutyl ether (Dowanol PnB), diethylene glycol monoethyl ether (ethyl Carbitol), dipropylene glycol n-butyl ether (Dowanol DPnB), diethylene glycol monophenyl ether (phenyl Carbitol), ethylene glycol monobutyl ether (butyl Cellosolve), diethylene glycol monobutyl ether (butyl Carbitol), dipropylene glycol monomethyl ether (Dowanol DPM), diisobutyl carbinol, 2-ethylhexyl alcohol, methyl isobutyl carbinol, ethylene glycol monophenyl ether (Dowanol Eph), propylene glycol monopropyl ether (Dowanol PnP), propylene glycol monophenyl ether (Dowanol PPh), diethylene glycol monopropyl ether (propyl Carbitol), diethylene glycol monohexyl ether (hexyl Carbitol), 2-ethylhexyl carbitol, dipropylene glycol monopropyl ether (Dowanol DPnP), tripropylene glycol monomethyl ether (Dowanol TPM), diethylene glycol monomethyl ether (methyl Carbitol), and tripropylene glycol monobutyl ether (Dowanol TPnB).

In an embodiment, $R_e$ is H, methyl, propyl, or butyl. In an embodiment, $R_f$ is —CH$_2$CF$_3$.

In an embodiment, the sulfonated polythiophene is obtained from a polythiophene that comprises a repeating unit

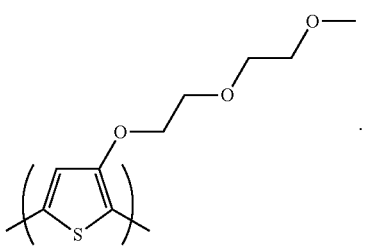

It would be understood by the ordinarily-skilled artisan that the repeating unit

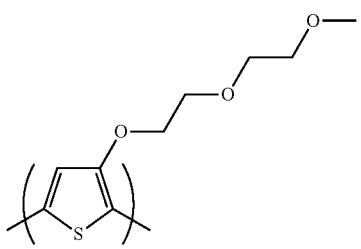

is derived from a monomer represented by the structure

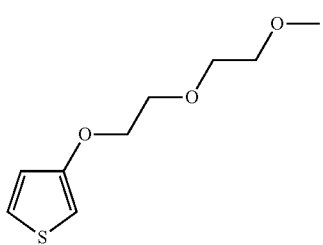

3-(2-(2-methoxyethoxy)ethoxy)thiophene [referred to herein as 3-MEET]

Accordingly, sulfonation of a polythiophene comprising a repeating unit

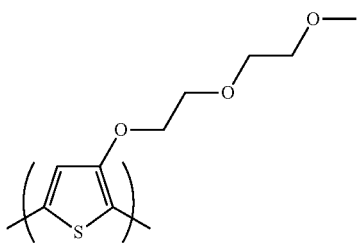

results in sulfonated poly(3-MEET).

In an embodiment, the sulfonated polythiophene is sulfonated poly(3-MEET).

In an embodiment, the sulfonated polythiophene is obtained from a polythiophene that comprises repeating units complying with formula (I) in an amount of greater than 50% by weight, typically greater than 80% by weight, more typically greater than 90% by weight, even more typically greater than 95% by weight, based on the total weight of the repeating units.

It would be clear to a person of ordinary skill in the art that, depending on the purity of the starting monomer compound(s) used to form the conjugated polymer to be sulfonated, the polymer formed may contain repeating units derived from impurities. As used herein, the term "homopolymer" is intended to mean a polymer comprising repeating units derived from one type of monomer, but may contain repeating units derived from impurities. In an embodiment, the sulfonated polythiophene is obtained from a polythiophene that is a homopolymer wherein essentially all of the repeating units are repeating units complying with formula (I).

The sulfonated conjugated polymer is obtained from a conjugated polymer typically having a number average molecular weight between about 1,000 and 1,000,000 g/mol. More typically, the conjugated polymer has a number average molecular weight between about 5,000 and 100,000 g/mol, even more typically about 10,000 to about 50,000 g/mol. Number average molecular weight may be determined according to methods known to those of ordinary skill in the art, such as, for example, by gel permeation chromatography.

The non-aqueous ink compositions of the present disclosure may optionally comprise additional compounds suitable for use in the HIL of an organic electronic device. Additional compounds suitable for use in the non-aqueous ink compositions of the present disclosure include, but are not limited to, polymeric hole carrier compounds and non-polymeric hole carrier compounds.

Examples of polymeric hole carrier compounds include, but are not limited to, poly[(9,9-dihexylfluorenyl-2,7-diyl)-alt-co-(N,N'bis{p-butylphenyl}-1,4-diaminophenylene)]; poly[(9,9-dioctylfluorenyl-2,7-diyl)-alt-co-(N,N'-bis{p-butylphenyl}-1,1'-biphenylene-4,4'-diamine)]; poly(9,9-dioctylfluorene-co-N-(4-butylphenyl)diphenylamine) (also referred to as TFB) and poly[N,N'-bis(4-butylphenyl)-N,N'-bis(phenyl)-benzidine] (commonly referred to as poly-TPD), as well as the non-sulfonated analogues of the sulfonated conjugated polymers described herein.

Examples of non-polymeric hole carrier compounds include, but are not limited to, N,N'-bis(3-methylphenyl)-N,N'-bis(phenyl)benzidine (CAS #65181-78-4); N,N'-bis(4-methylphenyl)-N,N'-bis(phenyl)benzidine; N,N'-bis(2-naphtalenyl)-N—N'-bis(phenylbenzidine) (CAS #139255-17-1); 1,3,5-tris(3-methyldiphenylamino)benzene (also referred to as m-MTDAB); N,N'-bis(1-naphtalenyl)-N,N'-bis(phenyl)benzidine (CAS #123847-85-8, NPB); 4,4',4"-tris(N,N-phenyl-3-methylphenylamino)triphenylamine (also referred to as m-MTDATA, CAS #124729-98-2); 4,4', N,N'-diphenylcarbazole (also referred to as CBP, CAS #58328-31-7); 1,3,5-tris(diphenylamino)benzene; 1,3,5-tris (2-(9-ethylcarbazyl-3)ethylene)benzene; 1,3,5-tris[(3-methylphenyl)phenylamino]benzene; 1,3-bis(N-carbazolyl)benzene; 1,4-bis(diphenylamino)benzene; 4,4'-bis(N-carbazolyl)-1,1'-biphenyl; 4,4'-bis(N-carbazolyl)-1,1'-biphenyl; 4-(dibenzylamino)benzaldehyde-N,N-diphenylhydrazone; 4-(diethylamino)benzaldehyde diphenylhydrazone; 4-(dimethylamino)benzaldehyde diphenylhydrazone; 4-(diphenylamino)benzaldehyde diphenylhydrazone; 9-ethyl-3-carbazolecarboxaldehyde diphenylhydrazone; copper(II) phthalocyanine; N,N'-bis(3-methylphenyl)-N,N'-diphenylbenzidine; N,N'-di-[(1-naphthyl)-N,N'-diphenyl]-1,1'-biphenyl)-4,4'-diamine; N,N'-diphenyl-N,N'-di-p-tolylbenzene-1,4-diamine; tetra-N-phenylbenzidine; titanyl phthalocyanine; tri-p-tolylamine; tris(4-carbazol-9-ylphenyl)amine; and tris[4-(diethylamino)phenyl]amine.

Additional hole carrier compounds are also described in, for example, US Patent Publications 2010/0292399 published Nov. 18, 2010; 2010/010900 published May 6, 2010; and 2010/0108954 published May 6, 2010.

The amount of sulfonated conjugated polymer, based on the total amount of the non-aqueous ink composition, is from about 0.01% wt to about 20.00% wt. Typically, the amount of sulfonated conjugated polymer from about 0.01% wt to about 5.00% wt, more typically from about 0.01% wt to about 1.00% wt, even more typically from about 0.05% wt to 0.50% wt, still more typically from about 0.09% wt to about 0.40% wt.

The polymeric acid suitable for use according to the present disclosure is a polymeric acid comprising one or more repeating units comprising at least one alkyl or alkoxy group which is substituted by at least one fluorine atom and at least one sulfonic acid (—SO$_3$H) moiety, wherein said alkyl or alkoxy group is optionally interrupted by at least one ether linkage (—O—) group.

In an embodiment, the polymeric acid comprises a repeating unit complying with formula (II) and a repeating unit complying with formula (III)

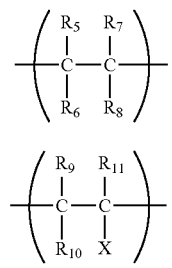

wherein each occurrence of $R_5$, $R_6$, $R_7$, $R_8$, $R_9$, $R_{10}$, and $R_{11}$ is, independently, H, halogen, fluoroalkyl, or perfluoroalkyl; and X is —[OC(R$_h$R$_i$)—C(R$_j$R$_k$)]$_q$—O—[CR$_l$R$_m$]$_z$—SO$_3$H, wherein each occurrence of R$_h$, R$_i$, R$_j$, R$_k$, R$_l$ and R$_m$ is, independently, H, halogen, fluoroalkyl, or perfluoroalkyl; q is 0 to 10; and z is 1-5.

In an embodiment, each occurrence of $R_5$, $R_6$, $R_7$, and $R_8$ is, independently, Cl or F. In an embodiment, each occurrence of $R_5$, $R_7$, and $R_8$ is F, and $R_6$ is Cl. In an embodiment, each occurrence of $R_5$, $R_6$, $R_7$, and $R_8$ is F.

In an embodiment, each occurrence of $R_9$, $R_{10}$, and $R_{11}$ is F.

In an embodiment, each occurrence of R$_h$, R$_i$, R$_j$, R$_k$, R$_l$ and R$_m$ is, independently, F, (C$_1$-C$_8$)fluoroalkyl, or (C$_1$-C$_8$) perfluoroalkyl.

In an embodiment, each occurrence of R$_l$ and R$_m$ is F; q is 0; and z is 2.

In an embodiment, each occurrence of $R_5$, $R_7$, and $R_8$ is F, and $R_6$ is Cl; and each occurrence of R$_l$ and R$_m$ is F; q is 0; and z is 2.

In an embodiment, each occurrence of $R_5$, $R_6$, $R_7$, and $R_8$ is F; and each occurrence of R$_l$ and R$_m$ is F; q is 0; and z is 2.

The ratio of the number of repeating units complying with formula (II) ("n") to the number of the repeating units complying with formula (III) ("m") is not particularly limited. The n:m ratio is typically from 9:1 to 1:9, more typically 8:2 to 2:8. In an embodiment, the n:m ratio is 9:1. In an embodiment, the n:m ratio is 8:2.

The polymeric acid suitable for use according to the present disclosure may be synthesized using methods known to those of ordinary skill in the art or obtained from commercially-available sources. For instance, the polymers comprising a repeating unit complying with formula (II) and a repeating unit complying with formula (III) may be made by co-polymerizing monomers represented by formula (IIa) with monomers represented by formula (IIIa)

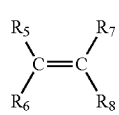

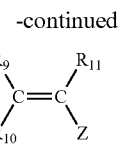

wherein Z is —[OC(R$_h$R$_i$)—C(R$_j$R$_k$)]$_q$—O—[CR$_l$R$_m$]$_z$—SO$_2$F, wherein R$_h$, R$_i$, R$_j$, R$_k$, R$_l$ and R$_m$, q, and z are as defined herein, according to known polymerization methods, followed by conversion to sulfonic acid groups by hydrolysis of the sulfonyl fluoride groups.

For example, tetrafluoroethylene (TFE) or chlorotrifluoroethylene (CTFE) may be copolymerized with one or more fluorinated monomers comprising a precursor group for sulfonic acid, such as, for example, F$_2$C=CF—O—CF$_2$—CF$_2$—SO$_2$F; F$_2$C=CF—[O—CF$_2$—CR$_{12}$F—O]$_q$—CF$_2$—CF$_2$—SO$_2$F, wherein R$_{12}$ is F or CF$_3$ and q is 1 to 10; F$_2$C=CF—O—CF$_2$—CF$_2$—CF$_2$—SO$_2$F; and F$_2$C=CF—OCF$_2$—CF$_2$—CF$_2$—CF$_2$—SO$_2$F.

The equivalent weight of the polymeric acid is defined as the mass, in grams, of the polymeric acid per mole of acidic groups present in the polymeric acid. The equivalent weight of the polymeric acid is from about 400 to about 15,000 g polymer/mol acid, typically from about 500 to about 10,000 g polymer/mol acid, more typically from about 500 to 8,000 g polymer/mol acid, even more typically from about 500 to 2,000 g polymer/mol acid, still more typically from about 600 to about 1,700 g polymer/mol acid.

Suitable polymeric acids are, for instance, those marketed by E. I. DuPont under the trade name NAFION®, those marketed by Solvay Specialty Polymers under the trade name AQUIVION®, or those marketed by Asahi Glass Co. under the trade name FLEMION®.

The amount of polymeric acid, based on the total amount of the non-aqueous ink composition, is typically from about 0.01% wt to about 5.00% wt, more typically from about 0.01% wt to about 1.00% wt, even more typically from about 0.05% wt to 0.50% wt, still more typically from about 0.06% wt to about 0.30% wt.

In the ink composition according to the present disclosure, the sulfonated conjugated polymer-to-polymeric acid ratio (sulfonated conjugated polymer:polymeric acid ratio), based on the combined weight of the sulfonated conjugated polymer and polymeric acid, is from 10:90 to 90:10, typically from 20:80 to 80:20, more typically from 40:60 to 60:40, even more typically 60:40 to 50:50.

In an embodiment, the ink composition according to the present disclosure further comprises one or more optional matrix compounds known to be useful in hole injection layers (HILs) or hole transport layers (HTLs).

The matrix compound can be a lower or higher molecular weight compound, and is different from the sulfonated conjugated polymer and/or polymeric acid described herein. The matrix compound may be organic or inorganic. The matrix compound can be, for example, a synthetic polymer that is different from the sulfonated conjugated polymer and/or polymeric acid. See, for example, US Patent Publication No. 2006/0175582 published Aug. 10, 2006. The synthetic polymer can comprise, for example, a carbon backbone. In some embodiments, the synthetic polymer has at least one polymer side group comprising an oxygen atom or a nitrogen atom. The synthetic polymer may be a Lewis base. Typically, the synthetic polymer comprises a carbon backbone and has a glass transition temperature of greater than 25° C. The synthetic polymer may also be a semicrystalline or crystalline polymer that has a glass transition temperature equal to or lower than 25° C. and/or a melting point greater than 25° C. The synthetic polymer may comprise acidic groups.

The matrix compound can be a planarizing agent. A matrix compound or a planarizing agent may be comprised of, for example, a polymer or oligomer, such as an organic polymer, such as poly(styrene) or poly(styrene) derivatives, such as poly(4-hydroxystyrene); poly(vinyl acetate) or derivatives thereof; poly(ethylene glycol) or derivatives thereof; poly(ethylene-co-vinyl acetate); poly(pyrrolidone) or derivatives thereof (e.g., poly(1-vinylpyrrolidone-co-vinyl acetate)); poly(vinyl pyridine) or derivatives thereof; poly(methyl methacrylate) or derivatives thereof; poly(butyl acrylate); poly(aryl ether ketones); poly(aryl sulfones); poly (esters) or derivatives thereof; or combinations thereof.

The matrix compound may comprise inorganic compounds. For example, inorganic compounds, such as silicon oxide, molybdenum oxide, zirconium oxide, titanium oxide, and mixtures thereof, may be used to increase thermal stability and/or surface energy of films and HILs formed from the non-aqueous ink compositions of the present disclosure. Such inorganic compounds may be used in any form, such as, for example, in the form of nanoparticles.

In an embodiment, the non-aqueous ink composition comprises a matrix compound different from the sulfonated conjugated polymer and/or polymeric acid described herein.

In an embodiment, the matrix compound is poly(styrene) or poly(styrene) derivative.

In an embodiment, the matrix compound is poly(4-hydroxystyrene).

The matrix compound or a planarizing agent may be comprised of, for example, at least one semiconducting matrix component. The semiconducting matrix component is different from the conjugated polymer and/or polymeric acid described herein. The semiconducting matrix component can be a semiconducting small molecule or a semiconducting polymer that is typically comprised of repeat units comprising hole carrying units in the main-chain and/or in a side-chain. The semiconducting matrix component may be in the neutral form or may be doped, and is typically soluble and/or dispersible in organic polar or non-polar, protic or aprotic solvents, such as, for example, acetonitrile, DMSO, DMF, NMP, DMPU, and mixtures thereof.

The amount of the matrix compound can be controlled and measured as a weight percentage relative to the total amount of the ink composition. In an embodiment, the amount of the matrix compound is from 0 to about 50 wt. %, typically from about 0.5% wt. to about 30 wt. %, more typically from about 1 wt. % to about 20 wt. %, still more typically about 1 wt. % to about 10 wt. %.

The non-aqueous ink compositions of the present disclosure comprise an amine compound. It has been surprisingly discovered that the presence of an amine compound in the non-aqueous ink compositions of the present disclosure not only provides ink compositions having good shelf-life and stability, the films formed from the non-aqueous ink compositions disclosed herein exhibit increased homogeneity and the OLED devices comprising HILs formed from the inventive non-aqueous ink compositions exhibit good performance.

Suitable amine compounds for use in the non-aqueous ink compositions of the present disclosure include, but are not limited to, ethanolamines and alkylamines.

Examples of suitable ethanolamines include dimethylethanol amine [$(CH_3)_2NCH_2CH_2OH$], triethanol amine [$N(CH_2CH_2OH)_3$], and N-tert-Butyldiethanol amine [$t-C_4H_9N(CH_2CH_2OH)_2$].

Alkylamines include primary, secondary, and tertiary alkylamines. Examples of primary alkylamines include, for example, ethylamine [$C_2H_5NH_2$], n-butylamine [$C_4H_9NH_2$], t-butylamine [$C_4H_9NH_2$], n-hexylamine [$C_6H_{13}NH_2$], n-decylamine[$C_{10}H_{21}NH_2$], and ethylenediamine [$H_2NCH_2CH_2NH_2$]. Secondary alkylamines include, for example, diethylamine [$(C_2H_5)_2NH$], di(n-propylamine) [$(n-C_3H_9)_2NH$], di(iso-propylamine) [$(i-C_3H_9)_2NH$], and dimethyl ethylenediamine [$CH_3NHCH_2CH_2NHCH_3$]. Tertiary alkylamines include, for example, trimethylamine [$(CH_3)_3N$], triethylamine [$(C_2H_5)_3N$], tri(n-butyl)amine [$(C_4H_9)_3N$], and tetramethyl ethylenediamine [$(CH_3)_2NCH_2CH_2N(CH_3)_2$].

In an embodiment, the amine compound is a tertiary alkylamine. In an embodiment, the amine compound is triethylamine.

The amount of the amine compound can be controlled and measured as a weight percentage relative to the total amount of the ink composition. In an embodiment, the amount of the amine compound is at least 0.01 wt. %, at least 0.10 wt. %, at least 1.00 wt. %, at least 1.50 wt. %, or at least 2.00 wt. %, with respect to the total amount of the ink composition. In an embodiment, the amount of the amine compound is from about 0.01 to about 2.00 wt. %, typically from about 0.05% wt. to about 1.50 wt. %, more typically from about 0.1 wt. % to about 1.0 wt. %, with respect to the total amount of the ink composition.

The liquid carrier used in the non-aqueous ink composition according to the present disclosure comprises an organic solvent or a blend of organic solvents. In an embodiment, the ink composition consists essentially of or consists of an organic solvent or a blend of organic solvents. The blend of organic solvents comprises two or more organic solvents adapted for use and processing with other layers, such as the anode or light emitting layer, in a device.

Organic solvents suitable for use in the liquid carrier may be polar or non-polar, protic or aprotic solvents. Examples of suitable organic solvents include, but are not limited to, aliphatic and aromatic ketones, organosulfur solvents, such as dimethyl sulfoxide (DMSO) and 2,3,4,5-tetrahydrothiophene-1,1-dioxide (tetramethylene sulfone; Sulfolane); tetrahydrofuran (THF), tetrahydropyran (THP), chloroform, alkylated benzenes, halogenated benzenes, N-methylpyrrolidinone (NMP), dimethyl tetrahydropyrimidinone (DMPU), dimethylformamide (DMF), dimethylacetamide (DMAc), dichloromethane, acetonitrile, dioxanes, ethyl acetate, ethyl benzoate, methyl benzoate, dimethyl carbonate, ethylene carbonate, propylene carbonate, 3-methoxypropionitrile, 3-ethoxypropionitrile, dimethyl propionamide, γ-butyrolactone, or combinations thereof. The sulfonated conjugated polymer and/or the polymeric acid is/are typically highly soluble and highly processable in these solvents.

Aliphatic and aromatic ketones include, but are not limited to, acetone, acetonyl acetone, methyl ethyl ketone (MEK), methyl isobutyl ketone, methyl isobutenyl ketone, 2-hexanone, 2-pentanone, acetophenone, ethyl phenyl ketone, cyclohexanone, and cyclopentanone. In some embodiments, ketones with protons on the carbon located alpha to the ketone are avoided, such as cyclohexanone, methyl ethyl ketone, and acetone.

Other organic solvents might also be considered that solubilize the conjugated polymer, that swell the conjugated polymer, or that even act as non-solvents for the conjugated polymer. Such other solvents may be included in the liquid carrier in varying quantities to modify ink properties such as wetting, viscosity, morphology control.

Other organic solvents suitable for use according to the present disclosure include ethers, such as anisole, ethoxybenzene, dimethoxy benzenes and glycol ethers, such as, ethylene glycol diethers, such as 1,2-dimethoxyethane, 1,2-diethoxyethane, and 1,2-dibutoxyethane; diethylene glycol diethers such as diethylene glycol dimethyl ether, and diethylene glycol diethyl ether; propylene glycol diethers such as propylene glycol dimethyl ether, propylene glycol diethyl ether, and propylene glycol dibutyl ether; dipropylene glycol diethers, such as dipropylene glycol dimethyl ether, dipropylene glycol diethyl ether, and dipropylene glycol dibutyl ether; as well as higher analogues (i.e., tri- and tetra-analogues) of the ethylene glycol and propylene glycol ethers mentioned herein.

Still other solvents can be considered, such as ethylene glycol monoether acetates and propylene glycol monoether acetates, wherein the ether can be selected, for example, from methyl, ethyl, n-propyl, iso-propyl, n-butyl, sec-butyl, tert-butyl, and cyclohexyl. Also, higher glycol ether analogues of above list such as di-, tri- and tetra-. Examples include, but are not limited to, propylene glycol methyl ether acetate, 2-ethoxyethyl acetate, 2-butoxyethyl acetate.

Additional examples of suitable organic solvents include alcohols, such as isopropanol, ethanol, and methanol, and alkylene glycol monoethers. Examples of suitable alkylene glycol monoethers include, but are not limited to, ethylene glycol monohexyl ether (hexyl Cellosolve), propylene glycol methyl ether (Dowanol PM), propylene glycol monobutyl ether (Dowanol PnB), diethylene glycol monoethyl ether (ethyl Carbitol), dipropylene glycol n-butyl ether (Dowanol DPnB), diethylene glycol monophenyl ether (phenyl Carbitol), ethylene glycol monobutyl ether (butyl Cellosolve), diethylene glycol monobutyl ether (butyl Carbitol), dipropylene glycol monomethyl ether (Dowanol DPM), diisobutyl carbinol, 2-ethylhexyl alcohol, methyl isobutyl carbinol, ethylene glycol monophenyl ether (Dowanol Eph), propylene glycol monopropyl ether (Dowanol PnP), propylene glycol monophenyl ether (Dowanol PPh), diethylene glycol monopropyl ether (propyl Carbitol), diethylene glycol monohexyl ether (hexyl Carbitol), 2-ethylhexyl carbitol, dipropylene glycol monopropyl ether (Dowanol DPnP), tripropylene glycol monomethyl ether (Dowanol TPM), diethylene glycol monomethyl ether (methyl Carbitol), and tripropylene glycol monobutyl ether (Dowanol TPnB).

In an embodiment, the liquid carrier comprises DMSO, sulfolane, dimethyl tetrahydropyrimidinone, dimethyl propionamide, 3-methoxypropionitrile, γ-butyrolactone, ethylene glycol, or a blend thereof.

In an embodiment, the liquid carrier comprises sulfolane, dimethyl tetrahydropyrimidinone, 3-methoxypropionitrile, dimethyl propionamide, or a blend thereof.

In an embodiment, the liquid carrier comprises γ-butyrolactone, ethylene glycol, or a blend thereof.

As disclosed herein, the organic solvents disclosed herein can be used in varying proportions in the liquid carrier, for example, to improve the ink characteristics, such as substrate wettability, ease of solvent removal, viscosity, surface tension, and jettability.

The amount of liquid carrier in the ink composition according to the present disclosure is from about 50 wt. % to about 99 wt. %, typically from about 75 wt. % to about 99 wt. %, still more typically from about 90 wt. % to about 99 wt. %, with respect to the total amount of ink composition.

The total solids content (% TS) in the non-aqueous ink composition according to the present disclosure is from about 0.1 wt. % to about 50 wt. %, typically from about 0.3 wt. % to about 40 wt. %, more typically from about 0.5 wt. % to about 10 wt. %, still more typically from about 1 wt. % to about 7 wt. %, with respect to the total amount of ink composition.

The present disclosure relates to processes for preparing the non-aqueous ink compositions described herein.

The present disclosure relates to a process for preparing a non-aqueous ink composition described herein, the process comprising:
  (i) mixing an aqueous dispersion of the sulfonated conjugated polymer, an aqueous dispersion of the polymeric acid, and, optionally, a matrix compound to form an initial aqueous mixture;
  (ii) removing the water from the initial aqueous mixture to form a product;
  (iii) dissolving and/or dispersing the product of step (ii) in one or more organic solvents; and
  (iv) adding an amine compound to the mixture formed in step (iii), thereby forming the non-aqueous ink composition.

In step (i) of the process, mixing may be achieved using any method known to those of ordinary skill in the art. For example, a vortex mixer may be used. One or more organic solvents miscible in water may be used to aid dissolution and/or dispersion of the components.

In step (ii) of the process, the removing of water may be achieved using standard methods known in the art, for example, by rotary evaporation or by spray drying. It would be understood by the ordinarily-skilled artisan that the one or more organic solvents miscible in water, if used in step (i), may remain in the product even when the water has been removed.

The present disclosure relates to a process for preparing a non-aqueous ink composition described herein, the process comprising:
  (ia) isolating dry sulfonated conjugated polymer from an aqueous dispersion of sulfonated conjugated polymer;
  (iia) isolating dry polymeric acid from an aqueous dispersion of polymeric acid;
  (iiia) combining the dry sulfonated conjugated polymer of step (ia) and the dry polymeric acid of step (iia), and, optionally, a matrix compound;
  (iva) dissolving and/or dispersing the mixture formed in step (iiia) in one or more organic solvents and an amine compound, thereby forming the non-aqueous ink composition.

In steps (ia) and (iia), isolating the dry sulfonated conjugated polymer and the dry polymeric acid, respectively, may be achieved by removing the water from their respective aqueous dispersions, which can be done, for example, by rotary evaporation or by spray drying.

The present disclosure relates to a process for preparing a non-aqueous ink composition described herein, the process comprising:
  (ib) preparing a non-aqueous solution of sulfonated conjugated polymer;
  (iib) preparing a non-aqueous solution of polymeric acid;
  (iiib) optionally, preparing a non-aqueous solution of matrix compound;
  (ivb) mixing an amount each of the non-aqueous solution of sulfonated conjugated polymer, the non-aqueous solution of polymeric acid, and, optionally, the non-aqueous solution of matrix compound;
  (vb) adding one or more organic solvents and an amine compound to the mixture formed in step (ivb), thereby forming the non-aqueous ink composition.

In steps (ib) and (iib), the non-aqueous stock solutions of sulfonated conjugated polymer and polymeric acid, respectively, may be prepared by isolating the solid components from their respective aqueous dispersions and combining each dried component with one or more organic solvents and an amine compound.

In step (iiib), a non-aqueous stock solution of the optional matrix compound may be prepared by simply dissolving the matrix compound in one or more organic solvents.

In step (ivb), an amount of stock solution of sulfonated conjugated polymer and an amount of stock solution of polymeric acid, and, optionally, an amount of the matrix stock solution are then mixed. In step (vb), one or more organic solvents and an amine compound is added to the resulting mixture to give the final ink composition.

The non-aqueous ink composition according to the present disclosure can be cast and annealed as a film on a substrate.

Thus, the present disclosure also relates to a process for forming a hole-carrying film, the process comprising:
  1) coating a substrate with a non-aqueous ink composition disclosed herein; and
  2) annealing the coating on the substrate, thereby forming the hole-carrying film.

The coating of the ink composition on a substrate can be carried out by methods known in the art including, for example, spin casting, spin coating, dip casting, dip coating, slot-dye coating, ink jet printing, gravure coating, doctor blading, and any other methods known in the art for fabrication of, for example, organic electronic devices. In some embodiments, the non-aqueous ink composition may be filtered, typically under pressure, prior to coating the ink composition on a substrate.

The substrate can be flexible or rigid, organic or inorganic. Suitable substrate materials include, for example, glass, including, for example, display glass, ceramic, metal, and plastic films.

As used herein, the term "annealing" refers to any general process for forming a hardened layer, typically a film, on a substrate coated with the non-aqueous ink composition of the present disclosure. General annealing processes are known to those of ordinary skill in the art. Typically, the solvent is removed from the substrate coated with the non-aqueous ink composition. The removal of solvent may be achieved, for example, by heating the coating layered on the substrate to a certain temperature (annealing temperature), maintaining the temperature for a certain period of time (annealing time), and then allowing the resulting layer, typically a film, to slowly cool to room temperature.

The process of annealing may improve the mechanical and/or electrical properties of the sulfonated polythiophene polymer and/or the polymeric acid by, for example, reducing or removing internal stresses and strains, reducing or removing defects, and aligning the polymer chains to improve structural ordering.

The step of annealing can be carried out by heating the substrate coated with the ink composition using any method known to those of ordinary skill in the art, for example, by heating in an oven or on a hot plate. Annealing can be carried out under an inert environment, for example, nitrogen atmosphere or noble gas atmosphere, such as, for example, argon gas. Annealing may be carried out in air atmosphere. The pressure of the annealing environment may also be modified to facilitate removal of solvent. For example, the annealing may be carried out in a vacuum.

There is no particular limitation to the annealing temperature so long as the components of the film to be formed remain stable to the heat used for annealing. In an embodiment, the annealing temperature is from about 25° C. to about 350° C., typically 150° C. to about 250° C.

The annealing time is the time for which the annealing temperature is maintained. The annealing time is from about 5 to about 60 minutes, typically from about 15 to about 30 minutes.

In an embodiment, the annealing temperature is from about 25° C. to about 350° C., typically 150° C. to about 250° C., and the annealing time is from about 5 to about 60 minutes, typically for about 15 to about 30 minutes.

The present disclosure relates to the hole-carrying film formed by the process described herein.

Transmission of visible light is important, and good transmission (low absorption) at higher film thicknesses is particularly important. For example, the film made according to the process of the present disclosure can exhibit a transmittance (typically, with a substrate) of at least about 85%, typically at least about 90%, of light having a wavelength of about 380-800 nm. In an embodiment, the transmittance is at least about 90%.

In one embodiment, the film made according to the process of the present disclosure has a thickness of from about 5 nm to about 500 nm, typically from about 5 nm to about 150 nm, more typically from about 20 nm to 120 nm.

In an embodiment, the film made according to the process of the present disclosure exhibits a transmittance of at least about 90% and has a thickness of from about 5 nm to about 500 nm, typically from about 5 nm to about 150 nm, more typically from about 20 nm to 120 nm. In an embodiment, the film made according to the process of the present disclosure exhibits a transmittance (% T) of at least about 90% and has a thickness of from about 20 nm to 120 nm.

The films made according to the processes of the present disclosure may be made on a substrate optionally containing an electrode or additional layers used to improve electronic properties of a final device. The resulting films may be intractable to one or more organic solvents, which can be the solvent or solvents used as liquid carrier in the ink for subsequently coated or deposited layers during fabrication of a device. The films may be intractable to, for example, toluene, which can be the solvent in the ink for subsequently coated or deposited layers during fabrication of a device.

The present disclosure also relates to a device comprising a film prepared according to the processes described herein. The devices described herein can be made by methods known in the art including, for example, solution processing. Inks can be applied and solvents removed by standard methods. The film prepared according to the processes described herein may be an HIL and/or HTL layer in the device.

Methods are known in the art and can be used to fabricate organic electronic devices including, for example, OLED and OPV devices. Methods known in the art can be used to measure brightness, efficiency, and lifetimes. Organic light emitting diodes (OLED) are described, for example, in U.S. Pat. Nos. 4,356,429 and 4,539,507 (Kodak). Conducting polymers which emit light are described, for example, in U.S. Pat. Nos. 5,247,190 and 5,401,827 (Cambridge Display Technologies). Device architecture, physical principles, solution processing, multilayering, blends, and compounds synthesis and formulation are described in Kraft et al., "Electroluminescent Conjugated Polymers—Seeing Polymers in a New Light," Angew. Chem. Int. Ed., 1998, 37, 402-428. The entire contents of these disclosures are herein incorporated by reference.

Light emitters known in the art and commercially available can be used including various conducting polymers as well as organic molecules, such as compounds available from Sumation, Merck Yellow, Merck Blue, American Dye Sources (ADS), Kodak (e.g., ALQ3 and the like), and even Aldrich, such as BEHP-PPV. Examples of such organic electroluminescent compounds include:

(i) poly(p-phenylene vinylene) and its derivatives substituted at various positions on the phenylene moiety;
(ii) poly(p-phenylene vinylene) and its derivatives substituted at various positions on the vinylene moiety;
(iii) poly(p-phenylene vinylene) and its derivatives substituted at various positions on the phenylene moiety and also substituted at various positions on the vinylene moiety;
(iv) poly(arylene vinylene), where the arylene may be such moieties as naphthalene, anthracene, furylene, thienylene, oxadiazole, and the like;
(v) derivatives of poly(arylene vinylene), where the arylene may be as in (iv) above, and additionally have substituents at various positions on the arylene;
(vi) derivatives of poly(arylene vinylene), where the arylene may be as in (iv) above, and additionally have substituents at various positions on the vinylene;
(vii) derivatives of poly(arylene vinylene), where the arylene may be as in (iv) above, and additionally have substituents at various positions on the arylene and substituents at various positions on the vinylene;
(viii) co-polymers of arylene vinylene oligomers, such as those in (iv), (v), (vi), and (vii) with non-conjugated oligomers; and
(ix) poly(p-phenylene) and its derivatives substituted at various positions on the phenylene moiety, including ladder polymer derivatives such as poly(9,9-dialkyl fluorene) and the like;
(x) poly(arylenes) where the arylene may be such moieties as naphthalene, anthracene, furylene, thienylene, oxadiazole, and the like; and their derivatives substituted at various positions on the arylene moiety;
(xi) co-polymers of oligoarylenes, such as those in (x) with non-conjugated oligomers;
(xii) polyquinoline and its derivatives;
(xiii) co-polymers of polyquinoline with p-phenylene substituted on the phenylene with, for example, alkyl or alkoxy groups to provide solubility;
(xiv) rigid rod polymers, such as poly(p-phenylene-2,6-benzobisthiazole), poly(p-phenylene-2,6-benzobisoxazole), poly(p-phenylene-2,6-benzimidazole), and their derivatives; and
(xv) polyfluorene polymers and co-polymers with polyfluorene units.

Preferred organic emissive polymers include SUMATION Light Emitting Polymers ("LEPs") that emit green, red, blue, or white light or their families, copolymers, derivatives, or mixtures thereof; the SUMATION LEPs are available from Sumation KK. Other polymers include polyspirofluorene-like polymers available from Covion Organic Semiconductors GmbH, Frankfurt, Germany (now owned by Merck®).

Alternatively, rather than polymers, small organic molecules that emit by fluorescence or by phosphorescence can serve as the organic electroluminescent layer. Examples of small-molecule organic electroluminescent compounds include, but are not limited, metal chelated oxinoid compounds, such as tris(8-hydroxyquinolinato)aluminum (ALQ3), bis(2-methyl-8-hydroxyquinolinato)aluminum, and oxo-bis(2-methyl-8-quinolinato)aluminum; 1,3-bis(N, N-dimethylaminophenyl)-1,3,4-oxidazole (OXD-8); bis(hydroxybenzoquinolinato) beryllium ($BeQ_2$); bis(diphenylvinyl)biphenylene (DPVBI); arylamine-substituted distyrylarylene (DSA amine); and cyclo-metallated iridium and platinum compounds. Examples of cyclo-metallated iridium compounds include complexes of iridium with phenylpyridine, phenylquinoline, or phenylpyrimidine ligands, for example, tris[2-phenylpyridinato-$C^2$,N]iridium(III) or "Ir(ppy)$_3$".

Such polymer and small-molecule compounds are well known in the art and are described in, for example, U.S. Pat. No. 5,047,687.

The devices can be fabricated in many cases using multilayered structures which can be prepared by, for example, solution or vacuum processing, as well as printing and patterning processes. In particular, use of the embodiments described herein for hole injection layers (HILs), wherein the composition is formulated for use as a hole injection layer, can be carried out effectively.

Examples of HIL in devices include:
1) Hole injection in OLEDs including PLEDs and SMOLEDs; for example, for HIL in PLED, all classes of conjugated polymeric emitters where the conjugation involves carbon or silicon atoms can be used. For HIL in SMOLED, the following are examples: SMOLED containing fluorescent emitters; SMOLED containing phosphorescent emitters; SMOLEDs comprising one or more organic layers in addition to the HIL layer; and SMOLEDs where the small molecule layer is processed from solution or aerosol spray or any other processing methodology. In addition, other examples include HIL in dendrimer or oligomeric organic semiconductor based OLEDs; HIL in ambipolar light emitting FET's where the HIL is used to modify charge injection or as an electrode;
2) Hole extraction layer in OPV;
3) Channel material in transistors;
4) Channel material in circuits comprising a combination of transistors, such as logic gates;
5) Electrode material in transistors;
6) Gate layer in a capacitor;
7) Chemical sensor where modification of doping level is achieved due to association of the species to be sensed with the conductive polymer;
8) Electrode or electrolyte material in batteries.

A variety of photoactive layers can be used in OPV devices. Photovoltaic devices can be prepared with photoactive layers comprising fullerene derivatives mixed with, for example, conducting polymers as described in, for example, U.S. Pat. Nos. 5,454,880; 6,812,399; and 6,933,436. Photoactive layers may comprise blends of conducting polymers, blends of conducting polymers and semiconducting nanoparticles, and bilayers of small molecules such as phthalocyanines, fullerenes, and porphyrins.

Common electrode compounds and substrates, as well as encapsulating compounds can be used.

In one embodiment, the cathode comprises Au, Ca, Al, Ag, or combinations thereof. In one embodiment, the anode comprises indium tin oxide. In one embodiment, the light emission layer comprises at least one organic compound.

Interfacial modification layers, such as, for example, interlayers, and optical spacer layers may be used.

Electron transport layers can be used.

The present disclosure also relates to a method of making a device described herein.

In an embodiment, the method of making a device comprises: providing a substrate; layering a transparent conductor, such as, for example, indium tin oxide, on the substrate;

providing the ink composition described herein; layering the ink composition on the transparent conductor to form a hole injection layer or hole transport layer; layering an active layer on the hole injection layer or hole transport layer (HTL); and layering a cathode on the active layer.

As described herein, the substrate can be flexible or rigid, organic or inorganic. Suitable substrate compounds include, for example, glass, ceramic, metal, and plastic films.

In another embodiment, a method of making a device comprises applying the ink composition as described herein as part of an HIL or HTL layer in an OLED, a photovoltaic device, an ESD, a SMOLED, a PLED, a sensor, a supercapacitor, a cation transducer, a drug release device, an electrochromic device, a transistor, a field effect transistor, an electrode modifier, an electrode modifier for an organic field transistor, an actuator, or a transparent electrode.

The layering of the ink composition to form the HIL or HTL layer can be carried out by methods known in the art including, for example, spin casting, spin coating, dip casting, dip coating, slot-dye coating, ink jet printing, gravure coating, doctor blading, and any other methods known in the art for fabrication of, for example, organic electronic devices.

In one embodiment, the HIL layer is thermally annealed. In one embodiment, the HIL layer is thermally annealed at temperature of about 25° C. to about 350° C., typically 150° C. to about 250° C. In one embodiment, the HIL layer is thermally annealed at temperature of about 25° C. to about 350° C., typically 150° C. to about 250° C., for about 5 to about 40 minutes, typically for about 15 to about 30 minutes.

In accordance with the present disclosure, an HIL or HTL can be prepared that can exhibit a transmittance (typically, with a substrate) of at least about 85%, typically at least about 90%, of light having a wavelength of about 380-800 nm. In an embodiment, the transmittance is at least about 90%.

In one embodiment, the HIL layer has a thickness of from about 5 nm to about 500 nm, typically from about 5 nm to about 150 nm, more typically from about 20 nm to 120 nm.

In an embodiment, the HIL layer exhibits a transmittance of at least about 90% and has a thickness of from about 5 nm to about 500 nm, typically from about 5 nm to about 150 nm, more typically from about 20 nm to 120 nm. In an embodiment, the HIL layer exhibits a transmittance (% T) of at least about 90% and has a thickness of from about 20 nm to 120 nm.

The inks, methods and processes, films, and devices according to the present disclosure are further illustrated by the following non-limiting examples.

EXAMPLES

The components used in the following examples are summarized in the following Table 1.

TABLE 1

| Summary of components | |
|---|---|
| S-poly(3-MEET) | Sulfonated poly(3-MEET) |
| TFE-VEFS 1 | TFE/perfluoro-2-(vinyloxy)ethane-1-sulfonic acid copolymer having equivalent weight of 676 g polymer/mol acid (available from Solvay as AQUIVION ® D66-20BS); n:m = 8:2 |
| TFE-VEFS 2 | TFE/perfluoro-2-(vinyloxy)ethane-1-sulfonic acid copolymer having equivalent weight of 999 g polymer/mol acid (available from Solvay as AQUIVION ® D98-20BS); n:m = 9:1 |

TABLE 1-continued

| Summary of components | |
|---|---|
| S-poly(3-MEET) | Sulfonated poly(3-MEET) |
| TFE-VPFS | TFE/perfluoro-2-((1-(vinyloxy)propan-2-yl)oxy)ethane-1-sulfonic acid copolymer (available from E. I. Dupont as NAFION ®) |
| PHOST | Poly(4-hydroxystyrene) |
| TEA | triethylamine |
| PGME | Propylene glycol methyl ether (available from Dow Chemical Co. as DOWANOL ™ PM) |

Example 1

Preparation of NQ Ink from an Initial Aqueous Mixture

An inventive non-aqueous (NQ) ink composition according to the present invention was prepared from an initial aqueous mixture. The initial aqueous mixture was prepared by mixing an aqueous dispersion of S-poly(3-MEET) (0.361% solids in water), an aqueous dispersion of TFE-VEFS 1 (20% solids in water), PHOST, and PGME. The resulting mixture is summarized in Table 2.

TABLE 2

| Initial aqueous mixture, 3.7% total solids | | |
|---|---|---|
| Component | Weight, g | Composition, % |
| S-poly(3-MEET) (0.361% solids in water) | 166.0 | 0.22 (solids) |
| TFE-VEFS 1 (20% solids in water) | 2.0 | 0.15 (solids) |
| PHOST | 9.0 | 3.33 (solids) |
| PGME | 91.0 | 33.71 |
| Water | 0.0 | 62.59 |

The solvents were then removed by rotary evaporation to yield 12.5 g of product.

The product was dispersed in 160 g of dimethyl sulfoxide (DMSO) and filtered under pressure to yield 164 g of dispersion at 6.7% solids. TEA (1.47 g) was then added to the dispersion to form an inventive NQ ink composition, designated NQ ink 1, which is summarized in Table 3.

TABLE 3

| NQ ink 1, 6.7% total solids | |
|---|---|
| Component | Composition, % |
| S-poly(3-MEET) | 0.40 (solids) |
| TFE-VEFS 1 | 0.27 (solids) |
| PHOST | 6.03 (solids) |
| DMSO | 92.40 |
| TEA | 0.90 |

NQ ink 1 is suitable for spin-coating applications.

Example 2

Preparation of NQ Ink from Solid Components

An inventive NQ ink composition according to the present invention was prepared from solid components.

Rotary evaporation was used to isolate the solid components of an aqueous dispersion of S-poly(3-MEET) (0.361% solids in water). This same technique was used to isolate the solid components from an aqueous dispersion of TFE-VEFS 1 (20% solids in water). The dried S-poly(3-MEET) (0.015 g) was combined with 0.23 g of PHOST and 0.01 g of dried TFE-VEFS 1 copolymer. DMSO (9.69 g) and TEA (0.06 g) were added to the solid components and the mixture was stirred for 2 hours at room temperature then filtered through a 0.22 μm polypropylene filter. The resulting NQ ink composition, designated NQ ink 2, is summarized in Table 4.

TABLE 4

NQ ink 2, 2.5% total solids

| Component | Composition, % |
|---|---|
| S-poly(3-MEET) | 0.18 (solids) |
| TFE-VEFS 1 | 0.12 (solids) |
| PHOST | 2.70 (solids) |
| DMSO | 96.40 |
| TEA | 0.60 |

NQ ink 2 is suitable for spin-coating applications.

Example 3

Preparation of NQ Ink from Stock Solutions

An inventive NQ ink composition according to the present invention was prepared from stock solutions. In the present example, NQ ink 2 (from Example 2) was prepared from stock solutions according to the following procedure.
Stock Solution Preparation:

Rotary evaporation was used to isolate the solid components of an aqueous dispersion of S-poly(3-MEET). The dried solids were used to prepare a stock solution of S-poly (3-MEET) at 0.5% solids in DMSO with TEA. The solution was made by combining 0.05 g of dried S-poly(3-MEET) with 9.93 g of DMSO and 0.02 g of TEA. The mixture was stirred for 2 hours at 70° C., cooled to room temperature, and then filtered through a 0.22 μm polypropylene filter.

Rotary evaporation was used to isolate the solid components of an aqueous dispersion of TFE-VEFS 1 copolymer. The dried solids were used to prepare a stock solution of TFE-VEFS 1 copolymer at 3.0% solids in DMSO. The solution was made by combining 0.3 g of dried TFE-VEFS 1 copolymer with 9.70 g of DMSO. The mixture was stirred for 1 hour room temperature then filtered through a 0.22 μm polypropylene filter.

A stock solution of PHOST at 5.0% solids was prepared by combining 0.5 g of PHOST with 9.50 g of DMSO. The solution was stirred for 1 hour room temperature then filtered through a 0.22 μm polypropylene filter.
Ink Preparation from Stock Solutions:

The final NQ ink was prepared by adding 0.18 g of the TFE-VEFS 1 stock solution to 1.80 g of the S-poly(3-MEET) stock solution and the mixture was put under vortex for fifteen seconds. Once the solution was homogeneous, 2.19 g of the PHOST stock solution, 0.81 g of DMSO, and 0.03 g of TEA were added. The resulting NQ ink was stirred for 1 hour at room temperature then filtered through a 0.22 μm polypropylene filter.

Example 4

Preparation of NQ Ink from an Initial Aqueous Mixture Containing Sulfolane

Inventive non-aqueous (NQ) ink compositions according to the present invention was prepared from an initial aqueous mixture containing sulfolane. The initial aqueous mixture was prepared by mixing an aqueous dispersion of S-poly(3-MEET) (0.361% solids in water), an aqueous dispersion of TFE-VEFS 1 (20% solids in water), PHOST, and sulfolane. The resulting mixture is summarized in Table 5.

TABLE 5

Initial aqueous mixture containing sulfolane, 2.9% solids

| Component | Weight, g | Composition, % |
|---|---|---|
| S-poly(3-MEET) (0.361% solids in water) | 84.35 | 0.22 (solids) |
| TFE-VEFS 1 (20% solids in water) | 1.02 | 0.15 (solids) |
| PHOST | 4.57 | 3.33 (solids) |
| Sulfolane | 84.96 | 33.71 |
| Water | 0.0 | 62.59 |

Water was removed by rotary evaporation yielding 5.1 g of product at 6.0% solids in sulfolane solvent.

After rotary evaporation, 4.0 g of the composition in sulfolane was mixed with 4.0 g of dimethyl tetrahydropyrimidinone (DMPU), 8.0 g of 3-methoxypropionitrile (PCN), and 0.12 g of TEA to give an NQ ink composition, designated NQ ink 3a.

Another inventive NQ ink, designated NQ ink 3b, was prepared according to this procedure, except that dimethyl propionamide was used instead of PCN. The composition of NQ inks 3a and 3b are summarized in Table 6.

TABLE 6

NQ inks 3a and 3b

| Component | NQ ink 3a Composition, % | NQ ink 3b Composition, % |
|---|---|---|
| S-poly(3-MEET) | 0.090 (solids) | 0.090 (solids) |
| TFE-VEFS 1 | 0.060 (solids) | 0.060 (solids) |
| PHOST | 1.35 (solids) | 1.35 (solids) |
| TEA | 0.75 | 0.75 |
| Sulfolane | 24.44 | 24.44 |
| DMPU | 24.44 | 24.44 |
| PCN | 48.87 | — |
| Dimethyl propionamide | — | 48.87 |
| % total solids | 1.5 | 1.5 |

NQ inks 3a and 3b is suitable for inkjet printing applications.

Example 5

The inventive NQ ink of the present example was made according to the procedure described in Example 2, except that DMSO was replaced with γ-butyrolactone and ethylene glycol.

Rotary evaporation was used to isolate the solid components of an aqueous dispersion of S-poly(3-MEET). This same technique was used to isolate the solid components from an aqueous dispersion of TFE-VEFS 1. The dried S-poly(3-MEET) (0.012 g) was combined with 0.18 g of PHOST and 0.01 g of dried TFE-VEFS 1. γ-butyrolactone (8.38 g), ethylene glycol (1.36 g) and TEA (0.06 g) were added to the solid components and the mixture was stirred for 2 hours at 60° C., cooled to room temperature, and then filtered through a 0.22 μm polypropylene filter. The resulting NQ ink composition, designated NQ ink 4, is summarized in Table 7.

TABLE 7

| NQ ink 4, 2.0% total solids | |
|---|---|
| Component | Composition, % |
| S-poly(3-MEET) | 0.12 (solids) |
| TFE-VEFS 1 | 0.080 (solids) |
| PHOST | 1.8 (solids) |
| γ-butyrolactone | 83.77 |
| Ethylene glycol | 13.63 |
| TEA | 0.60 |

NQ ink 4 is suitable for inkjet printing applications.

Example 6

In the present example, NQ ink 4 (from Example 5) was prepared from stock solutions according to a procedure analogous to the one described in Example 3.

Stock Solution Preparation:

Rotary evaporation was used to isolate the solid components of an aqueous dispersion of S-poly(3-MEET). The dried solids were used to prepare a stock solution of S-poly(3-MEET) at 0.5% solids in a blend of γ-butyrolactone, ethylene glycol, and TEA. The solution was made by combining 0.05 g of dried S-poly(3-MEET) with 8.51 g of γ-butyrolactone, 1.38 g ethylene glycol, and 0.06 g TEA. The mixture was stirred for 2 hours at 60° C., cooled to room temperature, and then filtered through a 0.22 μm polypropylene filter.

Rotary evaporation was used to isolate the solid components of an aqueous dispersion of TFE-VEFS 1. The dried solids were used to prepare a stock solution of TFE-VEFS 1 at 3.0% solids in γ-butyrolactone, ethylene glycol, and TEA. The solution was made by combining 0.3 g of dried TFE-VEFS 1 with 8.29 g of γ-butyrolactone, 1.35 g ethylene glycol, and 0.06 g TEA. The mixture was stirred for 1 hour at room temperature then filtered through a 0.22 μm polypropylene filter.

A stock solution of PHOST at 5.0% solids was prepared by combining 0.5 g of PHOST with 8.12 g of γ-butyrolactone, 1.32 g ethylene glycol, and 0.06 g TEA. The mixture was stirred for 1 hour at room temperature then filtered through a 0.22 μm polypropylene filter.

Ink Preparation from Stock Solutions:

The final NQ ink was prepared by adding 0.27 g of the TFE-VEFS 1 stock solution to 2.40 g of the S-poly(3-MEET) stock solution and then the mixture was vortexed for fifteen seconds. Once the solution was homogeneous, 3.6 g of the PHOST stock solution, 3.19 g of γ-butyrolactone, 0.52 g ethylene glycol, and 0.02 g TEA were added. The ink was stirred for 1 hour at room temperature then filtered through a 0.22 μm polypropylene filter.

Example 7

The NQ inks of the present example were made according to the procedure described in Example 1, except that an aqueous dispersion of TFE-VEFS 2 (20% solids in water) was used instead of the aqueous dispersion of TFE-VEFS 1, and/or the % total solids of the NQ inks were modified by modifying the amount of product dispersed in DMSO. The NQ inks of the present example, designated NQ inks 5-8, are summarized in Table 8.

TABLE 8

| | NQ inks 5-8 | | | |
|---|---|---|---|---|
| Component | NQ ink 5 Composition, % | NQ ink 6 Composition, % | NQ ink 7 Composition, % | NQ ink 8 Composition, % |
| S-poly(3-MEET) | 0.18 (solids) | 0.35 (solids) | 0.15 (solids) | 0.18 (solids) |
| TFE-VEFS 1 | 0.12 (solids) | 0.24 (solids) | — | — |
| TFE-VEFS 2 | — | — | 0.15 (solids) | 0.18 (solids) |
| PHOST | 2.70 (solids) | 5.31 (solids) | 2.2 (solids) | 2.64 (solids) |
| DMSO | 96.4 | 93.2 | 97.2 | 96.7 |
| TEA | 0.6 | 0.9 | 0.3 | 0.3 |
| % total solids | 3.0 | 5.9 | 2.5 | 3.0 |

NQ inks 5-8 are suitable for spin-coating applications.

Example 8

Effect of TEA on Film Formation

Films were prepared from the inventive NQ inks and compared to films prepared from non-inventive NQ inks. Particularly, films were made from inventive NQ inks 7 and 8, and compared to films made from non-inventive NQ inks, designated Comparative ink 1 and Comparative ink 2. The inks used to form the films are summarized in Table 9.

TABLE 9

| Component | NQ ink 7 Composition, % | NQ ink 8 Composition, % | Comparative ink 1 Composition, % | Comparative ink 2 Composition, % |
|---|---|---|---|---|
| S-poly(3-MEET) | 0.15 (solids) | 0.18 (solids) | 0.15 (solids) | 0.18 (solids) |
| TFE-VEFS 2 | 0.15 (solids) | 0.18 (solids) | 0.15 (solids) | 0.18 (solids) |
| PHOST | 2.2 (solids) | 2.64 (solids) | 2.2 (solids) | 2.64 (solids) |
| DMSO | 97.2 | 96.7 | 97.5 | 97 |

TABLE 9-continued

| Component | NQ ink 7 Composition, % | NQ ink 8 Composition, % | Comparative ink 1 Composition, % | Comparative ink 2 Composition, % |
|---|---|---|---|---|
| TEA | 0.3 | 0.3 | — | — |
| % total solids | 2.5 | 3.0 | 2.5 | 3.0 |

Figure 2:
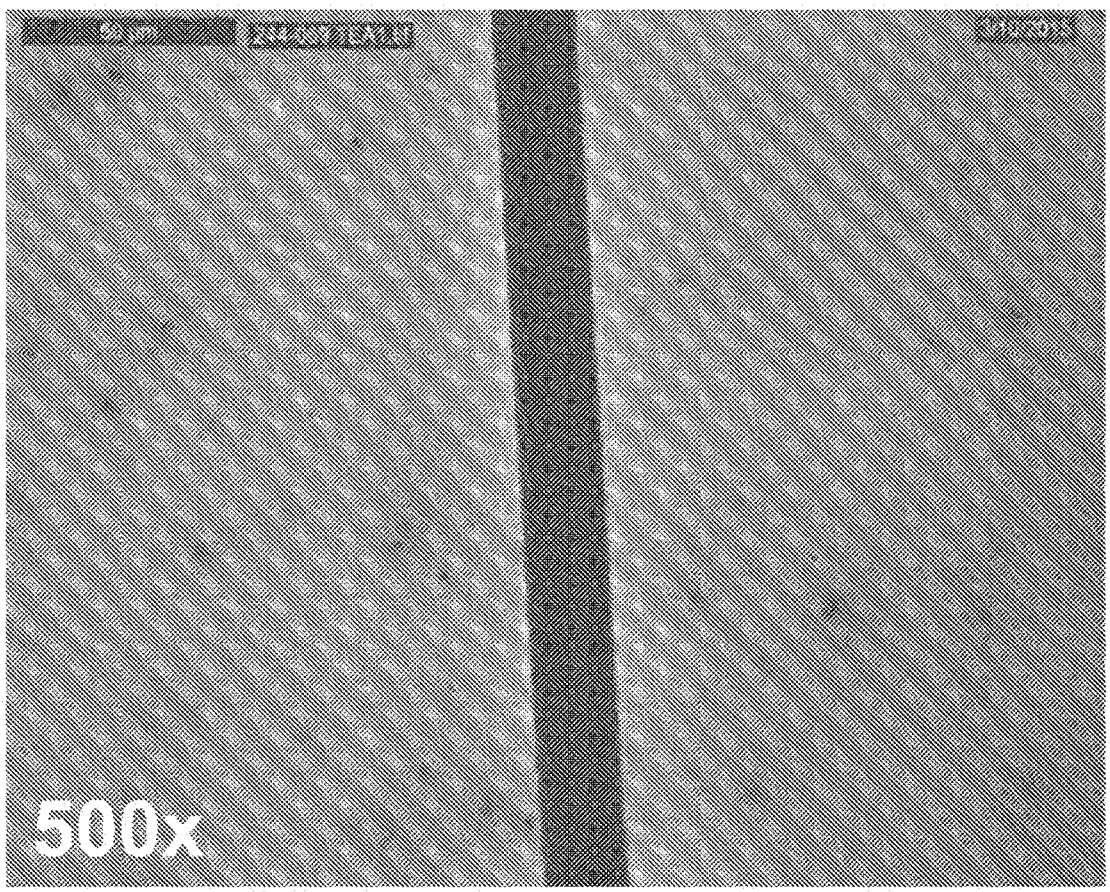
FIG. 2 shows a film formed from an inventive non-aqueous ink according to the present disclosure.

A film was formed by spin-coating an aliquot of NQ ink 8 on a substrate and a comparative film was analogously prepared by spin-coating Comparative ink 2 on another substrate. The film formed from NQ ink 8 is substantially particle-free and homogeneous (shown in FIG. 2) compared to the film formed from Comparative ink 2, which exhibits dramatic inhomogeneity (shown in FIG. 1).

Figure 3:
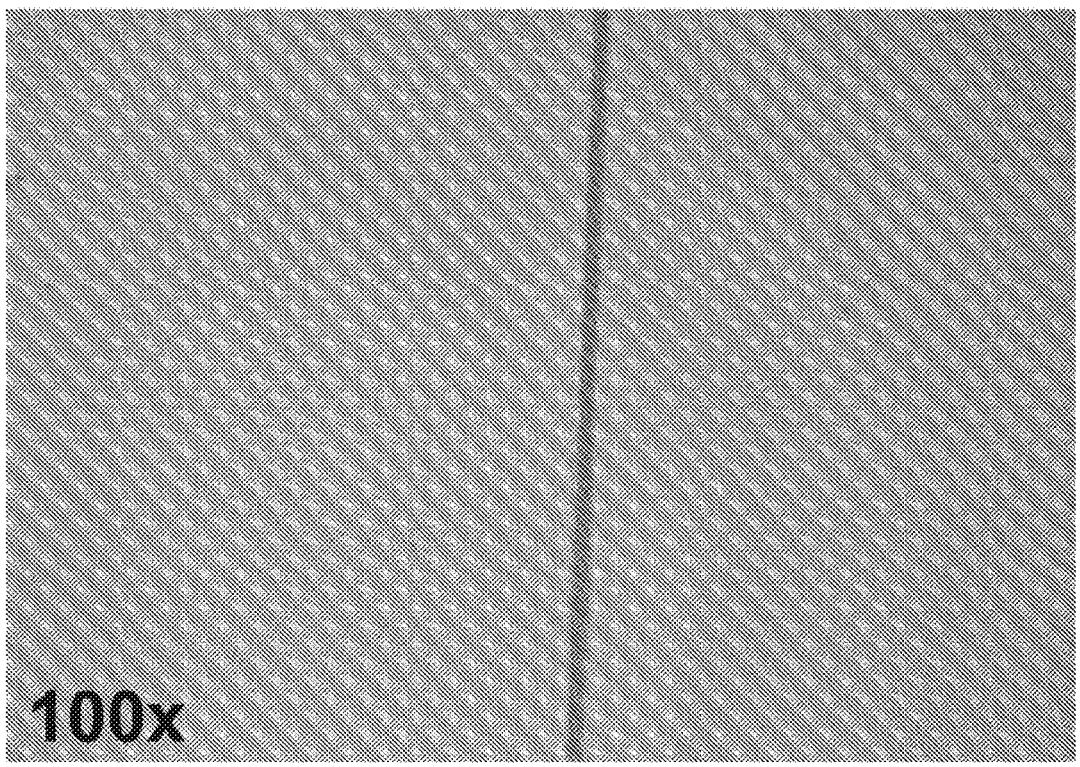
FIG. 3 shows a film formed from an inventive non-aqueous ink according to the present disclosure at 100× magnification.
Figure 4:
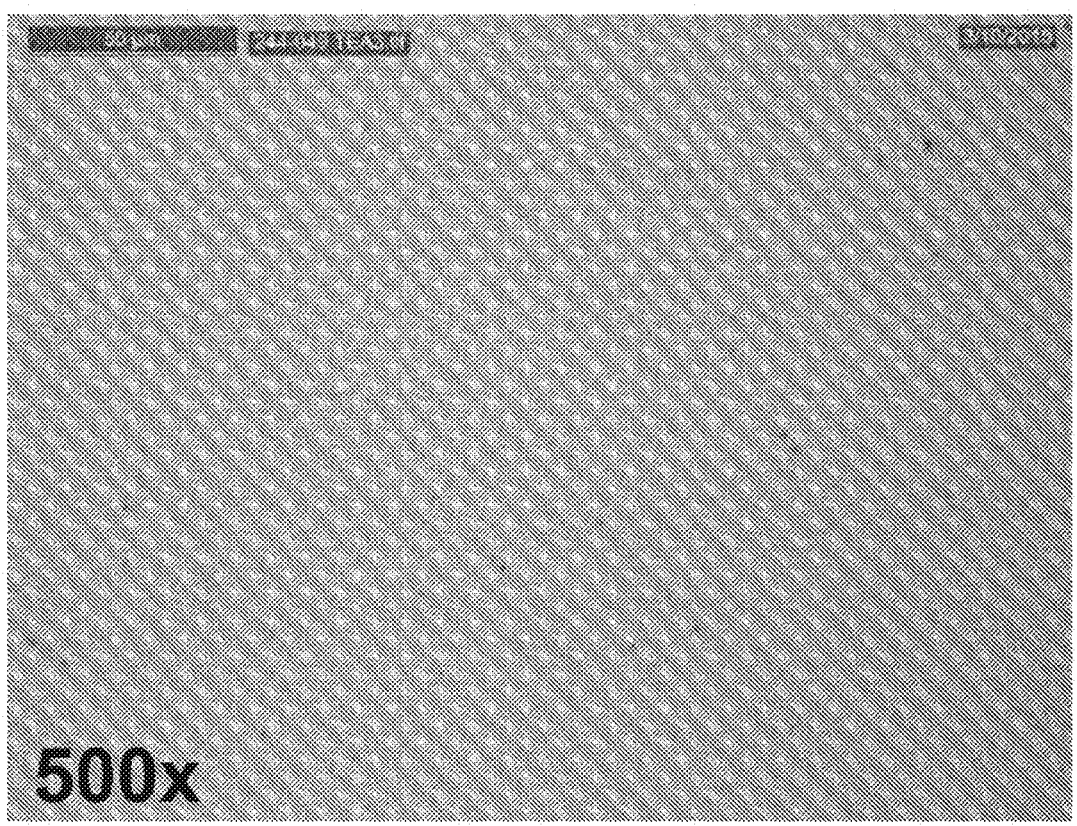
FIG. 4 shows a film formed from an inventive non-aqueous ink according to the present disclosure at 500× magnification.

Similarly, a film was formed by spin-coating an aliquot of NQ ink 7 on a substrate and a comparative film was analogously prepared by spin-coating Comparative ink 1 on another substrate. The film formed from NQ ink 7 at both 100× and 500× magnification are shown in FIGS. 3 and 4, respectively. The film formed from NQ ink 7 is homogeneous compared to the film formed from Comparative ink 1 (not shown).

Example 9

OLED Device Fabrication and Characterization

The device fabrication described below is intended as an example and does not in any way imply the limitation of the invention to the said fabrication process, device architecture (sequence, number of layers, etc.) or materials other than the HIL materials claimed.

The OLED devices described herein were fabricated on indium tin oxide (ITO) surfaces deposited on glass substrates.

The ITO surface was pre-patterned to define the pixel area of 0.05 cm². Before depositing an NQ ink to form an HIL on the substrates, pre-conditioning of the substrates was performed. The device substrates were first cleaned by ultrasonication in various solutions or solvents. The device substrates were ultrasonicated in a dilute soap solution, followed by distilled water, then acetone, and then isopropanol, each for about 20 minutes. The substrates were dried under nitrogen flow. Subsequently, the device substrates were then transferred to a vacuum oven set at 120° C. and kept under partial vacuum (with nitrogen purging) until ready for use. The device substrates were treated in a UV-Ozone chamber operating at 300 W for 20 minutes immediately prior to use.

Before the HIL ink composition is deposited onto an ITO surface, filtering of the ink composition through a polypropylene 0.2-μm filter was performed.

The HIL was formed on the device substrate by spin coating the NQ ink. Generally, the thickness of the HIL after spin-coating onto the ITO-patterned substrates is determined by several parameters such as spin speed, spin time, substrate size, quality of the substrate surface, and the design of the spin-coater. General rules for obtaining certain layer thickness are known to those of ordinary skill in the art. After spin-coating, the HIL layer was dried on a hot plate, typically at a temperature (anneal temperature) of from 150° C. to 250° C. for 15-30 minutes.

The substrates comprising the inventive HIL layers were then transferred to a vacuum chamber where the remaining layers of the device stack were deposited by means of physical vapor deposition.

All steps in the coating and drying process are done under an inert atmosphere, unless otherwise stated.

N,N'-bis(1-naphtalenyl)-N,N'-bis(phenyl)benzidine (NPB) was deposited as a hole transport layer on top of the HIL followed by an iridium-based emissive layer, a tris(8-hydroxyquinolinato)aluminum (ALQ3) electron transport and emissive layer, and LiF and Al as cathode. The pre-patterned ITO on glass acts as the anode.

The OLED device comprises pixels on a glass substrate whose electrodes extended outside the encapsulated area of the device which contain the light emitting portion of the pixels. The typical area of each pixel is 0.05 cm². The electrodes were contacted with a current source meter such as a Keithley 2400 source meter with a bias applied to the ITO electrode while the aluminum electrode was earthed. This results in positively charged carriers (holes) and negatively charged carriers being injected into the device which form excitons and generate light. In this example, the HIL assists the injection of charge carriers into the light emitting layer.

Simultaneously, another Keithley 2400 source meter is used to address a large area silicon photodiode. This photodiode is maintained at zero volts bias by the 2400 source meter. It is placed in direct contact with area of the glass substrate directly below the lighted area of the OLED pixel. The photodiode collects the light generated by the OLED converting them into photocurrent which is in turn read by the source meter. The photodiode current generated is quantified into optical units (candelas/sq. meter) by calibrating it with the help of a Minolta CS-200 Chromameter.

During the testing of the device, the Keithley 2400 addressing the OLED pixel applies a voltage sweep to it. The resultant current passing through the pixel is measured. At the same time the current passing through the OLED pixel results in light being generated which then results in a photocurrent reading by the other Keithley 2400 connected to the photodiode. Thus the voltage-current-light or IVL data for the pixel is generated.

An OLED device was fabricated using NQ ink 6 for formation of the HIL. A comparative OLED device was fabricated using a comparative ink, designated Comparative ink 3, for formation of the HIL. These OLED devices were then tested. The components of NQ ink 6 and Comparative ink 3 are summarized in Table 10.

TABLE 10

| Component | NQ ink 6 Composition, % | Comparative Ink 3 Composition, % |
|---|---|---|
| S-poly(3-MEET) | 0.35 (solids) | 0.132 (solids) |
| TFE-VEFS 1 | 0.24 (solids) | — |
| TFE-VPFS | — | 0.066 (solids) |
| Polystyrene sulfonic acid | — | 0.066 (solids) |
| PHOST | 5.31 (solids) | 1.936 (solids) |
| DMSO | 93.2 | — |
| Water | — | 53.79 |
| Butyl cellusolve | — | 44.01 |

TABLE 10-continued

| Component | NQ ink 6 Composition, % | Comparative Ink 3 Composition, % |
|---|---|---|
| TEA | 0.9 | — |
| % total solids | 5.9 | 2.2 |

Figure 5:
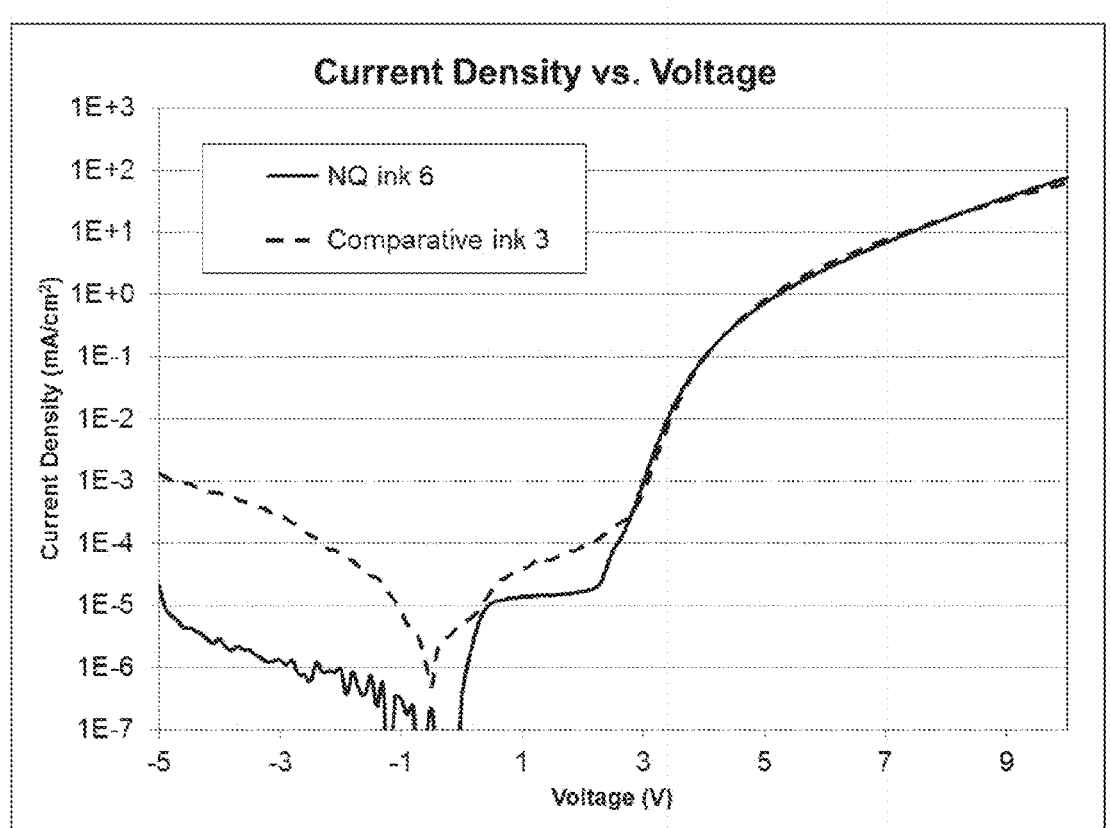
FIG. 5 shows a comparison of the current density as a function of voltage of an OLED device comprising an HIL made from an inventive non-aqueous ink (NQ ink 6) and that of an OLED device comprising an HIL made from a non-inventive ink (Comparative ink 3).

A comparison of the current density as a function of voltage of the OLED devices is shown in FIG. 5. The OLED device comprising the HIL made from NQ ink 6 exhibited lower leakage current compared to the OLED device comprising the HIL made from Comparative ink 3.

Figure 6:
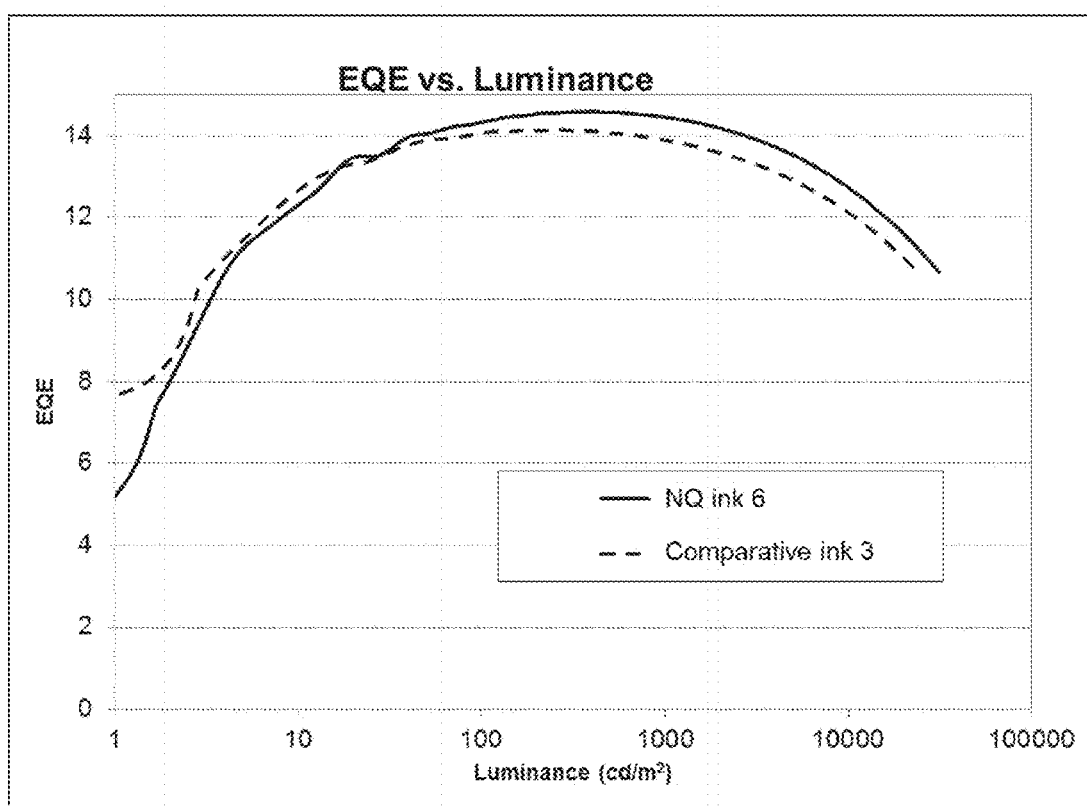
FIG. 6 shows a comparison of external quantum efficiency (EQE) as a function of luminance of an OLED device comprising an HIL made from an inventive non-aqueous ink (NQ ink 6) and that of an OLED device comprising an HIL made from a non-inventive ink (Comparative ink 3).

A comparison of external quantum efficiency (EQE) as a function of luminance of the OLED devices is shown in FIG. 6. The OLED device comprising the HIL made from NQ ink 6 exhibited similar or better EQE compared to the OLED device comprising the HIL made from Comparative ink 3.

Figure 7:
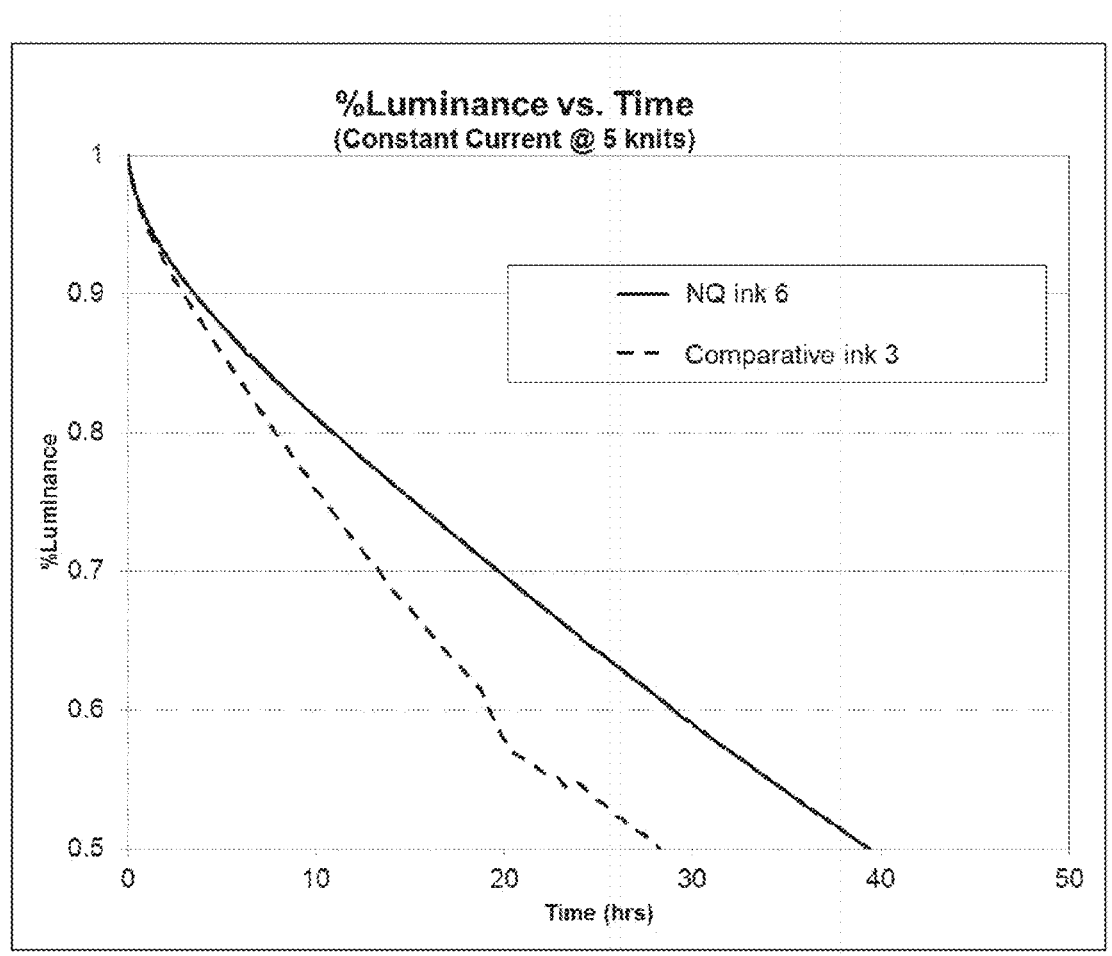
FIG. 7 shows a plot of % luminance as a function of time of an OLED device comprising an HIL made from an inventive non-aqueous ink (NQ ink 6) and that of an OLED device comprising the HIL made from a non-inventive ink (Comparative ink 3).
Figure 8:
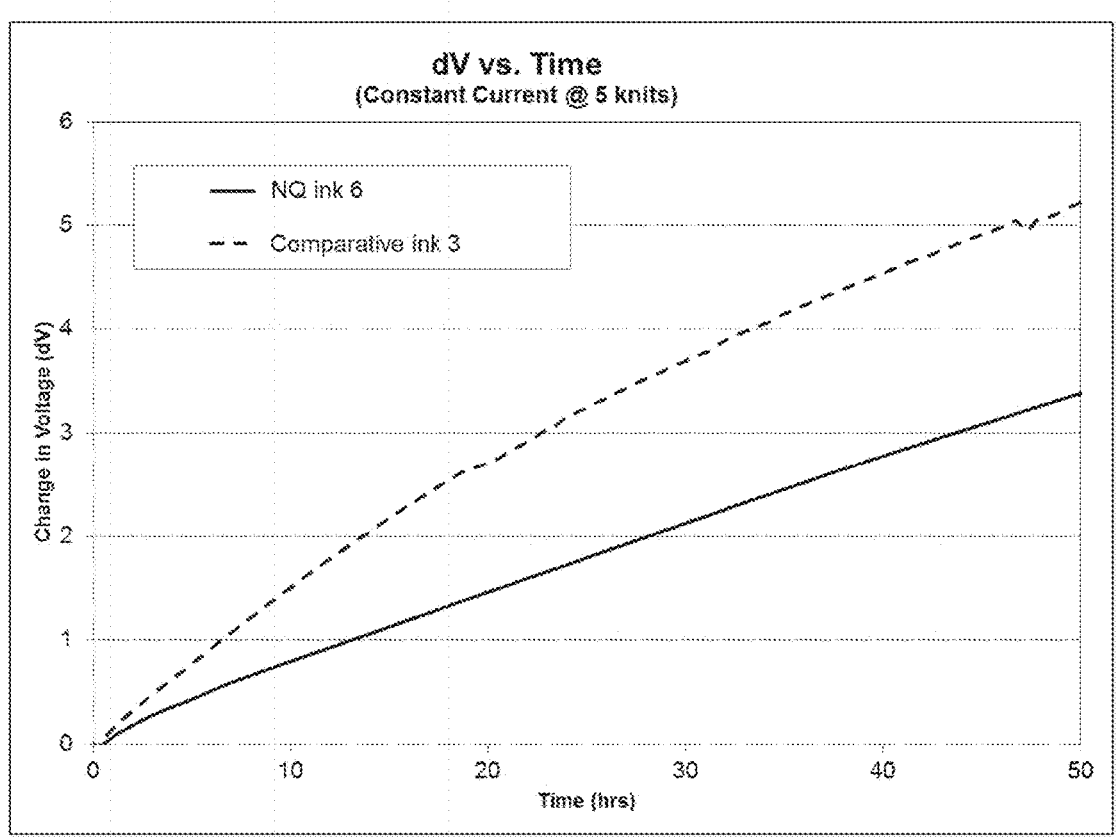
FIG. 8 shows a plot of voltage change as a function of time of an OLED device comprising an HIL made from an inventive non-aqueous ink (NQ ink 6) and that of an OLED device comprising the HIL made from a non-inventive ink (Comparative ink 3).

The difference in device lifetime was determined by a comparison of % luminance as a function of time and by comparison of voltage change as a function of time of the OLED devices. A plot of % luminance as a function of time is shown in FIG. 7 and a plot of voltage change as a function of time is shown in FIG. 8. The OLED device comprising the HIL made from NQ ink 6 exhibited improved device lifetime compared to the OLED device comprising the HIL made from Comparative ink 3.

What is claimed is:

1. A non-aqueous ink composition comprising:
   (a) a sulfonated conjugated polymer;
   (b) a polymeric acid comprising one or more repeating units comprising at least one alkyl or alkoxy group which is substituted by at least one fluorine atom and at least one sulfonic acid (—SO$_3$H) moiety, wherein said alkyl or alkoxy group is optionally interrupted by at least one ether linkage (—O—) group;
   (c) optionally, a matrix compound;
   (d) an amine compound; and
   (e) a liquid carrier comprising an organic solvent,
   wherein the sulfonated conjugated polymer is a sulfonated polythiophene which is obtained by sulfonation of a polythiophene comprising a repeating unit complying with formula (I)

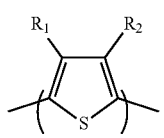

(I)

wherein R$_1$ is H and R$_2$ is —O[C(R$_a$R$_b$)—C(R$_c$R$_d$)—O]$_p$—R$_e$ and wherein each occurrence of R$_a$, R$_b$, R$_c$, and R$_d$, are each, independently, H, alkyl, fluoroalkyl, or aryl; R$_e$ is H, alkyl, fluoroalkyl, or aryl; and p is 1, 2, or 3.

2. The non-aqueous ink composition according to claim 1, wherein the sulfonated polythiophene is sulfonated poly(3-methoxyethoxyethoxy)thiophene.

3. The non-aqueous ink composition according to claim 1, wherein the sulfonated polythiophene is obtained by sulfonation of a polythiophene that comprises repeating units complying with formula (I) in an amount of greater than 70% by weight.

4. The non-aqueous ink composition according to claim 1, wherein the polymeric acid comprises a repeating unit complying with formula (II) and a repeating unit complying with formula (III)

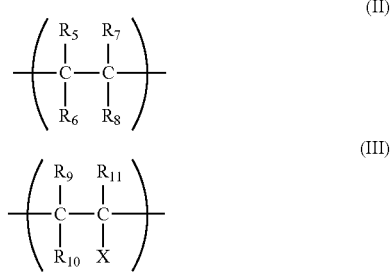

wherein
each occurrence of R$_5$, R$_6$, R$_7$, R$_8$, R$_9$, R$_{10}$, and R$_{11}$ is, independently, H, halogen, fluoroalkyl, or perfluoroalkyl; and
X is —[OC(R$_h$R$_i$)—C(R$_j$R$_k$)]$_q$—O—[CR$_l$R$_m$]$_z$—SO$_3$H, wherein each occurrence of R$_h$, R$_i$, R$_j$, R$_k$, R$_l$ and R$_m$ is, independently, H, halogen, fluoroalkyl, or perfluoroalkyl;
q is 0 to 10; and
z is 1-5.

5. The non-aqueous ink composition according to claim 4, wherein each occurrence of R$_5$, R$_6$, R$_7$, and R$_8$ is, independently, Cl or F.

6. The non-aqueous ink composition according to claim 5, wherein each occurrence of R$_5$, R$_7$, and R$_8$ is F, and R$_6$ is Cl.

7. The non-aqueous ink composition according to claim 5, wherein each occurrence of R$_5$, R$_6$, R$_7$, and R$_8$ is F.

8. The non-aqueous ink composition according to claim 4, wherein each occurrence of R$_9$, R$_{10}$, and R$_{11}$ is F.

9. The non-aqueous ink composition according to claim 4, wherein each occurrence of R$_h$, R$_i$, R$_j$, R$_k$, R$_l$ and R$_m$ is, independently, F, (C$_1$-C$_8$) fluoroalkyl, or (C$_1$-C$_8$) perfluoroalkyl.

10. The non-aqueous ink composition according to claim 4, wherein each occurrence of R$_l$ and R$_m$ is F; q is 0; and z is 2.

11. The non-aqueous ink composition according to claim 4, wherein the n:m ratio is 9:1.

12. The non-aqueous ink composition according to claim 4, wherein the n:m ratio is 8:2.

13. The non-aqueous ink composition according to claim 1, wherein the sulfonated conjugated polymer:polymeric acid ratio, based on the combined weight of the sulfonated conjugated polymer and polymeric acid, is from 10:90 to 90:10.

14. The non-aqueous ink composition according to claim 1, wherein the amount of sulfonated conjugated polymer, based on the total amount of the non-aqueous ink composition, is from 0.01% wt to 20.00% wt.

15. The non-aqueous ink composition according to claim 1, wherein the amount of polymeric acid, based on the total amount of the non-aqueous ink composition, is from 0.01% wt to 5.00% wt.

16. The non-aqueous ink composition according to claim 1, further comprising the matrix compound.

17. The non-aqueous ink composition according to claim 16, wherein the matrix compound is a synthetic polymer different from the sulfonated conjugated polymer and/or polymeric acid.

18. The non-aqueous ink composition according to claim 17, wherein the synthetic polymer is poly(styrene) or poly(styrene) derivative.

19. The non-aqueous ink composition according to claim 18, wherein the synthetic polymer is poly(4-hydroxystyrene).

20. The non-aqueous ink composition according to claim 1, wherein the amine compound is an alkylamine.

21. The non-aqueous ink composition according to claim 20, wherein the alkylamine is a tertiary alkylamine.

22. The non-aqueous ink composition according to claim 21, wherein the tertiary alkylamine is triethylamine.

23. The non-aqueous ink composition according to claim 1, wherein the amount of the amine compound is at least 0.01 wt. %, with respect to the total amount of the ink composition.

24. A non-aqueous ink composition comprising:
   (a) a sulfonated conjugated polymer;
   (b) a polymeric acid comprising one or more repeating units comprising at least one alkyl or alkoxy group which is substituted by at least one fluorine atom and at least one sulfonic acid (—SO$_3$H) moiety, wherein said alkyl or alkoxy group is optionally interrupted by at least one ether linkage (—O—) group;
   (c) optionally, a matrix compound;
   (d) an amine compound; and
   (e) a liquid carrier comprising an organic solvent,
wherein the polymeric acid comprises a repeating unit complying with formula (II) and a repeating unit complying with formula (III)

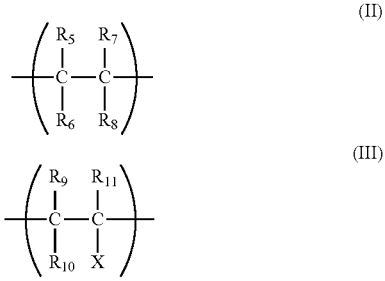

wherein
   each occurrence of $R_5$, $R_6$, $R_7$, $R_8$, $R_9$, $R_{10}$, and $R_{11}$ is, independently, H, halogen, fluoroalkyl, or perfluoroalkyl; and
   X is —[OC($R_h R_i$)—C($R_j R_k$)]$_q$—O—[CR$_l$R$_m$]$_z$—SO$_3$H,
      wherein each occurrence of $R_h$, $R_i$, $R_j$, $R_k$, $R_l$ and $R_m$ is, independently, H, halogen, fluoroalkyl, or perfluoroalkyl;
   q is 0 to 10; and
   z is 1-5.

25. The non-aqueous ink composition according to claim 24, wherein the sulfonated conjugated polymer is a sulfonated polythiophene.

26. The non-aqueous ink composition according to claim 25, wherein the sulfonated polythiophene is obtained by sulfonation of a polythiophene comprising a repeating unit complying with formula (I)

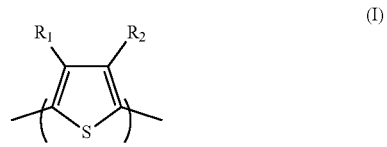

wherein $R_1$ and $R_2$ are each, independently, H, alkyl, fluoroalkyl, polyether, or alkoxy group.

27. The non-aqueous ink composition according to claim 24, further comprising the matrix compound.

28. The non-aqueous ink composition according to claim 27, wherein the matrix compound is a synthetic polymer different from the sulfonated conjugated polymer and/or polymeric acid.

29. The non-aqueous ink composition according to claim 28, wherein the synthetic polymer is poly(4-hydroxystyrene).

30. The non-aqueous ink composition according to claim 24, wherein the amine compound is an alkylamine.

31. A hole-carrying film formed by a process comprising:
   1) coating a substrate with a non-aqueous ink composition according to claim 1; and
   2) annealing the coating on the substrate, thereby forming the hole-carrying film.

32. A device comprising the hole-carrying film according to claim 31, wherein the device is an OLED, OPV, transistor, capacitor, sensor, transducer, drug release device, electrochromic device, or battery device.

33. A process for preparing the non-aqueous ink composition according to claim 1, the process comprising:
   (i) mixing an aqueous dispersion of the sulfonated conjugated polymer, an aqueous dispersion of the polymeric acid, and, optionally, the matrix compound to form an initial aqueous mixture;
   wherein the sulfonated conjugated polymer is a sulfonated polythiophene which is obtained by sulfonation of a polythiophene comprising a repeating unit complying with formula (I)

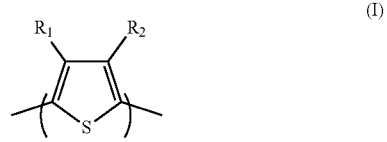

wherein $R_1$ is H and $R_2$ is —O[C($R_a R_b$)—C($R_c R_d$)—O]$_p$—$R_e$ and wherein each occurrence of $R_a$, $R_b$, $R_c$, and $R_d$, are each, independently, H, alkyl, fluoroalkyl, or aryl; $R_e$ is H, alkyl, fluoroalkyl, or aryl; and p is 1, 2, or 3; and
   wherein the polymeric acid comprises one or more repeating units comprising at least one alkyl or alkoxy group which is substituted by at least one fluorine atom and at least one sulfonic acid (—SO$_3$H) moiety, wherein said alkyl or alkoxy group is optionally interrupted by at least one ether linkage (—O—) group;
   (ii) removing water from the initial aqueous mixture to form a product;
   (iii) dissolving and/or dispersing the product of step (ii) in one or more of the organic solvent; and
   (iv) adding the amine compound to the mixture formed in step (iii), thereby forming the non-aqueous ink composition according to claim 1.

34. A process for preparing the non-aqueous ink composition according to claim 1, the process comprising:
(ia) isolating dry sulfonated conjugated polymer from an aqueous dispersion of the sulfonated conjugated polymer; wherein the sulfonated conjugated polymer is a sulfonated polythiophene which is obtained by sulfonation of a polythiophene comprising a repeating unit complying with formula (I)

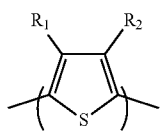
(I)

wherein $R_1$ is H and $R_2$ is —O[C($R_a R_b$)—C($R_c R_d$)—O]$_p$—$R_e$ and wherein each occurrence of $R_a$, $R_b$, $R_c$, and $R_d$, are each, independently, H, alkyl, fluoroalkyl, or aryl; $R_e$ is H, alkyl, fluoroalkyl, or aryl; and p is 1, 2, or 3;
(iia) isolating dry polymeric acid from an aqueous dispersion of the polymeric acid; wherein the polymeric acid comprises one or more repeating units comprising at least one alkyl or alkoxy group which is substituted by at least one fluorine atom and at least one sulfonic acid (—$SO_3H$) moiety, wherein said alkyl or alkoxy group is optionally interrupted by at least one ether linkage (—O—) group;
(iiia) combining the dry sulfonated conjugated polymer of step (ia) and the dry polymeric acid of step (iia), and, optionally, the matrix compound to form a mixture;
(iva) dissolving and/or dispersing the mixture formed in step (iiia) in one or more of the organic solvent and the amine compound, thereby forming the non-aqueous ink composition of claim 1.

35. A process for preparing the non-aqueous ink composition according to claim 1, the process comprising:
(ib) preparing a non-aqueous solution of the sulfonated conjugated polymer, wherein the sulfonated conjugated polymer is a sulfonated polythiophene which is obtained by sulfonation of a polythiophene comprising a repeating unit complying with formula (I)

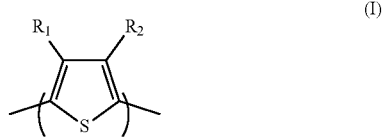
(I)

wherein $R_1$ is H and $R_2$ is —O[C($R_a R_b$)—C($R_c R_d$)—O]$_p$—$R_e$ and wherein each occurrence of $R_a$, $R_b$, $R_c$, and $R_d$, are each, independently, H, alkyl, fluoroalkyl, or aryl; $R_e$ is H, alkyl, fluoroalkyl, or aryl; and p is 1, 2, or 3;
(iib) preparing a non-aqueous solution of the polymeric acid, wherein the polymeric acid comprises one or more repeating units comprising at least one alkyl or alkoxy group which is substituted by at least one fluorine atom and at least one sulfonic acid (—$S_3H$) moiety, wherein said alkyl or alkoxy group is optionally interrupted by at least one ether linkage (—O—) group;
(iiib) optionally, preparing a non-aqueous solution of the matrix compound;
(ivb) mixing an amount each of the non-aqueous solution of the sulfonated conjugated polymer, the non-aqueous solution of the polymeric acid, and, optionally, the non-aqueous solution of matrix compound to form a mixture;
(vb) adding one or more of the organic solvent and the amine compound to the mixture formed in step (ivb), thereby forming the non-aqueous ink composition of claim 1.

36. A process for forming a hole-carrying film, the process comprising:
1) coating a substrate with a non-aqueous ink composition according to claims 1; and
2) annealing the coating on the substrate, thereby forming the hole-carrying film.

37. The process according to claim 36, wherein the annealing temperature is from about 25° C. to about 350° C., typically 150° C. to about 250° C.

38. The process according to claim 36, wherein the annealing time is from about 5 to about 60 minutes.

* * * * *

UNITED STATES PATENT AND TRADEMARK OFFICE
CERTIFICATE OF CORRECTION

PATENT NO. : 10,407,581 B2
APPLICATION NO. : 15/566796
DATED : September 10, 2019
INVENTOR(S) : Floryan De Campo et al.

Page 1 of 1

It is certified that error appears in the above-identified patent and that said Letters Patent is hereby corrected as shown below:

In the Claims

Claim 35, Column 2, Line 18, replace the term "( --S$_3$H)" with the term "( --SO$_3$H)".

Signed and Sealed this
Twenty-sixth Day of May, 2020

Andrei Iancu
*Director of the United States Patent and Trademark Office*